US009797970B2

(12) United States Patent
Zhou et al.

(10) Patent No.: US 9,797,970 B2
(45) Date of Patent: Oct. 24, 2017

(54) IMAGE DOMAIN SEGMENTED ECHO PLANAR MAGNETIC RESONANCE IMAGING USING A 2D EXCITATION RADIOFREQUENCY PULSE

(71) Applicant: The Board of Trustees of The University of Illinois, Urbana, IL (US)

(72) Inventors: Xiaohong Joe Zhou, Naperville, IL (US); Yi Sui, Waukesha, WI (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 35 days.

(21) Appl. No.: 15/097,530

(22) Filed: Apr. 13, 2016

(65) Prior Publication Data

US 2016/0307301 A1 Oct. 20, 2016

Related U.S. Application Data

(60) Provisional application No. 62/147,247, filed on Apr. 14, 2015.

(51) Int. Cl.
| | |
|---|---|
| *G06K 9/00* | (2006.01) |
| *G01R 33/483* | (2006.01) |
| *G01R 33/56* | (2006.01) |
| *G01R 33/561* | (2006.01) |

(52) U.S. Cl.
CPC ...... *G01R 33/4836* (2013.01); *G01R 33/5602* (2013.01); *G01R 33/5608* (2013.01); *G01R 33/5616* (2013.01)

(58) Field of Classification Search
CPC .................. G01R 33/5608; G01R 33/4836
See application file for complete search history.

(56) References Cited

U.S. PATENT DOCUMENTS

| | | | | |
|---|---|---|---|---|
| 2015/0301143 A1* | 10/2015 | Banerjee | ............ | G01R 33/4835 324/309 |
| 2015/0320335 A1* | 11/2015 | Zur | .......................... | A61N 7/02 600/410 |
| 2015/0362576 A1* | 12/2015 | Jurrissen | .............. | G01R 33/445 324/309 |
| 2016/0231409 A1* | 8/2016 | Taviani | .............. | G01R 33/5611 |

* cited by examiner

*Primary Examiner* — Oneal R Mistry
(74) *Attorney, Agent, or Firm* — Nancy R. Gamburd; Gamburd Law Group LLC

(57) ABSTRACT

Representative methods and systems are disclosed for reducing image distortion or increasing spatial resolution in echo planar magnetic resonance imaging. In representative embodiments, a targeted field of view (FOV) image is divided into segments, with each segment having a predetermined overlap region with an adjacent segment, such as in a phase-encoding direction. Image data is acquired for each segment, sequentially or simultaneously, using a reduced phase-encoding FOV with a 2D radiofrequency (RF) excitation pulse, and rotated and scaled magnetic field gradients. The 2D RF excitation pulse may also be modulated, such as onto a plurality of different carrier frequencies, for simultaneous acquisition of multiple segments in the same imaging plane. Using the spatial response of the 2D RF excitation pulse, the acquired image data for each segment of the plurality of segments is combined to generate a combined magnetic resonance image having the targeted field of view.

20 Claims, 16 Drawing Sheets

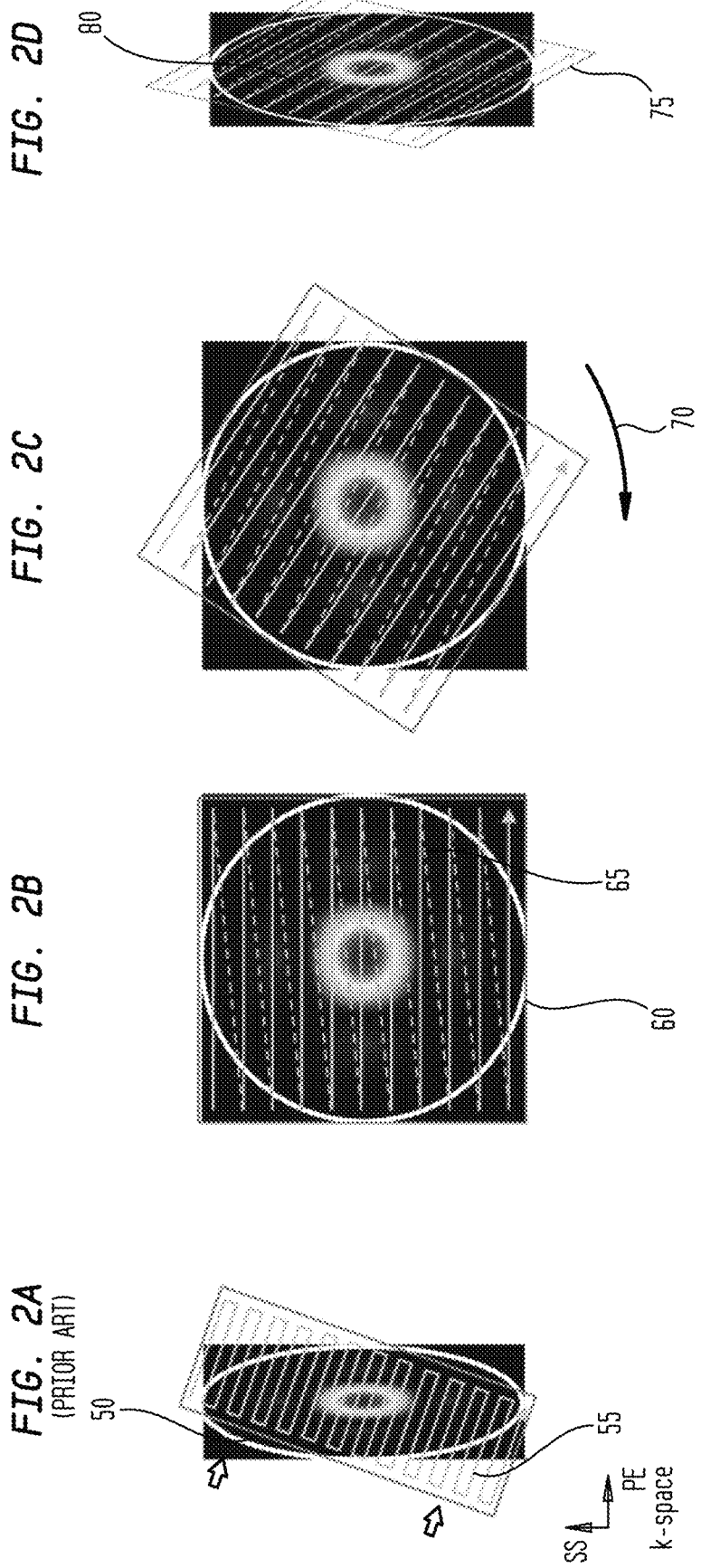

IMAGE DOMAIN SEGMENTED ECHO PLANAR MAGNETIC RESONANCE IMAGING USING A 2D EXCITATION RADIOFREQUENCY PULSE

CROSS-REFERENCE TO A RELATED APPLICATION

This application is a nonprovisional of and claims the benefit of and priority to U.S. Provisional Patent Application No. 62/147,247, filed Apr. 14, 2015, inventors Xiaohong Joe Zhou et al., titled "Methods for Reducing Image Distortion in Echo Planar MRI", which is commonly assigned herewith, and all of which is hereby incorporated herein by reference in its entirety with the same full force and effect as if set forth in its entirety herein.

STATEMENT REGARDING FEDERALLY SPONSORED RESEARCH OR DEVELOPMENT

This invention was made with government support under grant No. 1S10RR028898 awarded by the National Institutes of Health. The government has certain rights in this invention.

FIELD OF THE INVENTION

The present invention, in general, relates to magnetic resonance imaging, and more particularly, relates to reduction of image distortion in echo planar imaging by image domain segmentation in echo planar imaging using a 2D excitation radiofrequency pulse.

BACKGROUND OF THE INVENTION

Magnetic resonance imaging ("MRI") is a type of medical imaging modality for creating images of the inside of a human or animal body without using ionizing radiation such as x-rays. Mill uses a powerful magnet, such as a superconducting magnet, to create a strong, generally uniform, static magnetic field, usually referred to as "$B_0$" or the main magnetic field, oriented along the longitudinal axis of the MRI scanner, conventionally referred to as the "z axis". When a human body, or part of a human body, is placed in this main magnetic field, the nuclear spins that are associated with nuclei, such as hydrogen nuclei in tissue water (and to a lesser extent, other protons of other tissue types, such as lipids) become polarized. As a result, the magnetic moments that are associated with these spins become preferentially aligned along the direction of the main magnetic field, resulting in a small net tissue magnetization along the z axis. An MRI system also comprises components called gradient coils that produce smaller amplitude, spatially varying magnetic fields.

Typically, gradient coils are designed to produce magnetic field components that vary linearly in amplitude with position along one of the orthogonal x, y or z axes and, by convention, are referred to as Gx, Gy, and Gz magnetic field gradients. The Gx, Gy, and Gz magnetic field gradients from the gradient coils create various ramps on the corresponding magnetic field strengths, and concomitantly on the resonance frequencies of the nuclear spins, along these orthogonal axes, thereby spatially encoding the magnetic resonance ("MR") signal by creating selected resonant frequencies or signal phases at various locations in the subject. By convention, the Gz magnetic field gradient is a slice-selection gradient, the Gy magnetic field gradient is phase-encoding gradient, and the Gx magnetic field gradient is a frequency encoding or read gradient. Radio frequency ("RF") coils are used to create pulses of RF energy, as RF pulses interacting with the nuclear spins, at or near these various resonant frequencies. Subsequently, as the nuclear spins return to their equilibrium states (e.g., through T2 and T1 relaxation processes), an RF signal is emitted and detected by the MRI system.

In typical MR imaging, this process is repeated many times, at different phase-encoding gradients, for each selected slice or for multiple selected slices. Each of the corresponding received RF signals, with the influence from various magnetic field gradients, is then sampled, resulting in a corresponding line of "k-space", also referred to herein as the "reception" k-space. Acquisition of multiple k-space lines is generally required to produce an image. As a result, image acquisition is comparatively slow, and is consequently subject to various artifacts, such as artifacts from motion of the patient within the MRI scanner. From reception k-space, which has spatial frequency information, and using a transformation (e.g., an inverse Fourier transformation) and any of various image reconstruction algorithms, a computing system converts the k-space information into a corresponding image for viewing.

Echo planar imaging ("EPI") is a widely-used technique in MRI, especially to reduce image acquisition time, including multiple-shot EPI or single-shot EPI ("ss-EPI"). Single-shot echo planar pulse sequences are widely used in neuro-functional imaging, diffusion imaging, and perfusion imaging because of their fast acquisition speed, ability to freeze motion, and low specific absorption rate ("SAR"). These sequences, however, are highly susceptible to generating geometric distortions of the resulting image arising from, for example, static off-resonance effects such as magnetic susceptibility variations and $B_0$-field inhomogeneity, or dynamic perturbations, including eddy currents. This distortion can be particularly severe in the frontal and temporal lobes of the brain, where the air-filled paranasal sinus and petrous portion of the temporal bone impose difficulties in applications such as functional MRI ("fMRI") and diffusion imaging. Image distortion ($\Delta d$) in ss-EPI is given by (Equation 1):

$$\Delta d = \frac{\gamma}{2\pi} \frac{esp}{\Delta k_y} \Delta B_0$$

where $\gamma$ is the gyromagnetic ratio, esp is inter-echo spacing, $\Delta B_0$ is the change (i.e., inhomogeneity) of the main magnetic field $B_0$, and $\Delta k_y$ is the sampling interval in the phase-encoding direction of k-space (i.e., the distance between two consecutive k-space lines in the phase-encoding direction).

An obstinate and ongoing problem of EPI is image distortion, which is one of the primary obstacles preventing EPI from realizing its full potential as an imaging technology. As a consequence of this image distortion, EPI typically has been limited to low spatial resolutions. For example, to reduce distortion, echo spacing (esp) has been shortened by reducing the readout sampling points ($k_x$), which unfortunately results in a lower spatial resolution. Other methods have been used to maintain or increase the spatial resolution, such as multi-shot EPI (e.g., Short Axis PROPELLER (SAP)-EPI and Readout-Segmented (RS)-EPI). These techniques, however, have other problems such as phase inconsistency among different k-space segments and/or requirements for correcting motion using sophisticated reconstruction algorithms. Another approach to reducing image distortion has involved increasing $\Delta k_y$, as demonstrated in parallel imaging methods such as SENSE and GRAPPA. The performance of distortion reduction in parallel imaging increases with the acceleration factor R, but at an expense of a decreased signal-to-noise ratio (SNR). At a larger R, however, gain in distortion reduction is offset by more SNR loss, which comes from the intrinsic SNR loss due to the reduced data sampling, the additional SNR loss arising from the parallel imaging reconstruction algorithm, and the imperfections of receiver coil geometry, which is described as a "g-factor" (g-factor ≥1). More specifically, the SNR is decreased by a factor of g-factor·$\sqrt{R}$. Because the g-factor is also a non-linear function of R and increases drastically for a higher acceleration factor, the acceleration factor R is typically limited to 2-3 for SNR considerations, limiting the amount of distortion reduction in parallel imaging.

Accordingly, there is an ongoing need for new technologies for reducing image distortion in EPI while achieving high spatial resolution. Such a technology should also maintain the fast acquisition speed of traditional EPI and, in addition, should be able to provide various imaging advantages, such as simultaneous suppression of lipid signals, and also use in anatomical regions that traditionally have not benefited from accurate imaging using conventional EPI techniques.

SUMMARY OF THE INVENTION

The representative embodiments of the present invention provide numerous advantages. Representative embodiments provide more accurate imaging and improved spatial resolution over a large field of view ("FOV"), which enhances or enables medical diagnoses and/or image-guided medical treatments, for example and without limitation. Representative embodiments further provide improved spatial co-registration between anatomic images and functional, physiologic, and/or metabolic images, along with more robust imaging in anatomically challenging regions, including those anatomical regions in which conventional EPI techniques have been unable to provide accurate imaging due to significant image distortion levels.

Various representative embodiments include a system and a method for reducing image distortion in MRI comprising: dividing a targeted FOV image into multiple regions or segments, with a small overlap of the regions along the phase-encoding direction; sequentially or simultaneously acquiring k-space data for each region using a reduced phase-encoding FOV with a 2D radiofrequency (RF) excitation pulse to generate an image of the segment; reconstructing each segment image to form a sub-image corresponding to each of the multiple regions; and combining the sub-images into a full FOV image using an intensity weighting function along the phase-encoding direction, based on the RF excitation profile.

Various representative embodiments include a system and a method using a 2D RF pulse and first magnetic field gradient sequences for slice and segment selection, comprising designing a square excitation k-space coverage using two simultaneous, but different magnetic field gradients in unison; rotating the square excitation k-space by a predefined rotation angle using the gradient rotation matrix in an Mill system, resulting in an off-axis square coverage in k-space; mixing the original magnetic field gradient waveforms according to the rotation matrix prior to feeding to the actual physical magnetic field gradients; scaling the magnetic field gradient waveforms to produce an elliptical excitation k-space coverage whose aspect ratio is dictated by the slice thickness and the excited segment width along the phase-encoding direction, resulting in a deformation of the off-axis square excitation k-space coverage to a parallelogram enclosing the desired elliptical excitation k-space coverage with the shorter axis along the phase-encoding direction to select a segment, and the longer axis along the slice direction to select a thin slice such that any oversampling and under-sampling problems are avoided. The excitation k-space, distinct from the reception k-space, is described in greater detail below.

A representative method embodiment is disclosed for reducing image distortion or increasing spatial resolution in magnetic resonance imaging (MRI). The representative method comprises: using an MRI system, dividing a targeted field of view image into a plurality of segments, each segment of the plurality of segments having a predetermined overlap region with an adjacent segment; using the Mill system, acquiring image data for each segment of the plurality of segments using a reduced field of view with a 2D radiofrequency (RF) excitation pulse; using the MRI system, determining a spatial response of the 2D radiofrequency (RF) excitation pulse; and using the spatial response of the 2D radiofrequency (RF) excitation pulse in the phase-encoding direction, and using the MRI system, combining the acquired image data for each segment of the plurality of segments to generate a combined magnetic resonance image having the targeted field of view.

The representative method embodiment may further comprise: using the Mill system, selecting at least one segment of the plurality of segments for imaging by applying a pulse sequence of at least two magnetic field gradients corresponding to a rotated and scaled excitation k-space coverage. For example, a first magnetic field gradient (G"y) is generally or substantially in the phase-encoding direction and a second magnetic field gradient (G"z) is generally or substantially in a slice-selection direction, depending upon the amount of rotation and scaling, discussed below.

In a representative embodiment, the first magnetic field gradient (G"y) and the second magnetic field gradient (G"z) are magnetic field gradients which have been rotated and scaled to correspond to the rotated and scaled excitation k-space coverage, and are determined as G"y=a·G'y and G"z=b·G'z, where $$\begin{bmatrix} G'y \\ G'z \end{bmatrix} = \begin{bmatrix} \cos\theta & \sin\theta \\ -\sin\theta & \cos\theta \end{bmatrix} \begin{bmatrix} Gy \\ Gz \end{bmatrix},$$

where θ is a predetermined angle of rotation, a and b are predetermined scaling factors, and Gy and Gz are orthogonal magnetic field gradients defining an on-axis square excitation k-space. Depending upon the amount of rotation and scaling, magnetic field gradients G"y and G"z may no longer be generally or substantially orthogonal.

In a representative method embodiment, using the spatial response of the 2D radiofrequency (RF) excitation pulse may further comprise: using the MRI system, weighting corresponding image intensities within the predetermined overlap region of a segment with an adjacent segment to provide a normalized image intensity.

Also in a representative method embodiment, the step of combining the acquired image data for each segment of the plurality of segments to generate a combined magnetic resonance image having the targeted field of view may further comprise: using the MRI system, combining image data for the plurality of segments using:

$$S(y) = \sum_{i=1}^{n} w_i(y) S_i(y) \bigg/ \sum_{i=1}^{n} w_i^2(y)$$

where $S_i(y)$ is segmented image data, n is the total number of segments, $w_i(y)$ is the 2D RF pulse spatial response along the phase-encoding direction, and i represents the ith segment.

Also in a representative method embodiment, the step of acquiring image data for each segment of the plurality of segments may further comprise: using the MRI system, simultaneously acquiring the image data for the plurality of segments using the 2D radiofrequency (RF) excitation pulse modulated to simultaneously excite the plurality of segments. For example, the step of acquiring image data for each segment of the plurality of segments may further comprise: using the MRI system, simultaneously acquiring the image data for the plurality of segments using the 2D radiofrequency (RF) excitation pulse modulated onto a plurality of different carrier frequencies.

In a representative embodiment, the plurality of segments have at least one shape selected from the group consisting of: a plurality of parallel rectangles having predetermined overlap regions with an adjacent segment in a phase-encoding direction; a plurality of parallel rectangles in the phase-encoding direction having varying widths or aspect ratios in the phase-encoding direction; a plurality of concentric rings; a tiling of a plurality of geometric shapes covering the targeted field of view; and combinations thereof.

A magnetic resonance imaging (MRI) system is also disclosed for reducing image distortion in echo planar magnetic resonance (MR) images. A representative MRI system comprises: an RF transmitter adapted to generate a 2D radiofrequency (RF) excitation pulse; an RF receiver adapted to acquire image data for each segment of a plurality of segments using a reduced phase-encoding field of view; and one or more processors adapted to divide a targeted field of view image into the plurality of segments, each segment of the plurality of segments having a predetermined overlap region with an adjacent segment; to determine a spatial response of the 2D radiofrequency (RF) excitation pulse; and using the spatial response of the 2D radiofrequency (RF) excitation pulse, to combine the acquired image data for each segment of the plurality of segments to generate a combined magnetic resonance image having the targeted field of view.

In a representative system embodiment, the one or more processors may be further adapted to select at least one segment of the plurality of segments for imaging by determining at least two magnetic field gradients corresponding to a rotated and scaled excitation k-space coverage; and with the system further comprising: at least one gradient coil assembly to generate a pulse sequence of the at least two magnetic field gradients corresponding to the rotated and scaled excitation k-space coverage. Also for example, a first magnetic field gradient (G"y) may be generally or substantially in the phase-encoding direction and a second magnetic field gradient (G"z) may be generally or substantially in a slice-selection direction, depending upon the amount of rotation and scaling, as mentioned above.

In a representative MRI system embodiment, the first magnetic field gradient (G"y) and the second magnetic field gradient (G"z) are magnetic field gradients which have been rotated and scaled to correspond to the rotated and scaled excitation k-space coverage, and the one or more processors are further adapted to determine the first magnetic field gradient (G"y) and the second magnetic field gradient (G"z) as G"y=a·G'y and G"z=b·G'z, where $$\begin{bmatrix} G'y \\ G'z \end{bmatrix} = \begin{bmatrix} \cos\theta & \sin\theta \\ -\sin\theta & \cos\theta \end{bmatrix} \begin{bmatrix} Gy \\ Gz \end{bmatrix},$$

where θ is a predetermined angle of rotation, a and b are predetermined scaling factors, and Gy and Gz are orthogonal magnetic field gradients defining an on-axis square excitation k-space.

Also in a representative MRI system embodiment, the one or more processors may be further adapted to weight corresponding image intensities within the predetermined overlap region of a segment with an adjacent segment to provide a normalized image intensity.

For example, the one or more processors may be further adapted to generate the combined magnetic resonance image having the targeted field of view by combining image data for the plurality of segments using:

$$S(y) = \sum_{i=1}^{n} w_i(y) S_i(y) \bigg/ \sum_{i=1}^{n} w_i^2(y)$$

where $S_i(y)$ is segmented image data, n is the total number of segments, $w_i(y)$ is the 2D RF pulse spatial response along the phase-encoding direction, and i represents the ith segment.

In a representative MRI system embodiment, the RF transmitter may be further adapted to modulate the 2D radiofrequency (RF) excitation pulse to simultaneously excite the plurality of segments. For example, the RF transmitter may be further adapted to modulate the 2D radiofrequency (RF) excitation pulse onto a plurality of different carrier frequencies for simultaneous acquisition of the image data for the plurality of segments.

A method for generating magnetic field gradients for reducing image distortion or increasing spatial resolution in magnetic resonance imaging (MRI) is also disclosed. A representative method embodiment comprises: using an MRI system, dividing a targeted field of view image into a plurality of segments, with each segment of the plurality of segments having a predetermined overlap region with an adjacent segment in a phase-encoding direction; using the MRI system, generating an on-axis square excitation k-space coverage with two simultaneous, but different magnetic field gradients in unison, Gy and Gz; using the MRI system, rotating the square excitation k-space by a predefined rotation angle using a gradient rotation matrix to form a rotated, off-axis square coverage in excitation k-space, with new, rotated magnetic field gradients G'y and G'z; using the MRI system, scaling the rotated square excitation k-space by predefined scaling factors to generate rotated and scaled magnetic field gradients G"y and G"z; and using the MRI system, and using the rotated and scaled magnetic field gradients G"y and G"z, generating a 2D radiofrequency (RF) excitation pulse and acquiring image data for each segment of a plurality of segments.

In a representative embodiment, the step of scaling the rotated magnetic field gradients may further comprise: using the MRI system, forming a parallelogram-shaped excitation k-space coverage with a shorter axis along the phase-encoding direction and a longer axis along a slice-selection direction by scaling the magnetic field gradients as: G″y=a·G'y and G″z=b·G'z, where a and b are predetermined scaling factors; and wherein the method may further comprise: using the MRI system, applying a rotation matrix to generate the rotated magnetic field gradients G'y and G'z as:

$$\begin{bmatrix} G'y \\ G'z \end{bmatrix} = \begin{bmatrix} \cos\theta & \sin\theta \\ -\sin\theta & \cos\theta \end{bmatrix} \begin{bmatrix} Gy \\ Gz \end{bmatrix},$$

where θ is the predefined rotation angle, $$\begin{bmatrix} \cos\theta & \sin\theta \\ -\sin\theta & \cos\theta \end{bmatrix}$$

is the rotation matrix, and Gy and Gz are orthogonal magnetic field gradients defining an on-axis square excitation k-space.

Another representative magnetic resonance imaging (MRI) system is disclosed for reducing image distortion or increasing spatial resolution in echo planar magnetic resonance (MR) image. A representative MRI system embodiment comprises: an RF transmitter adapted to generate a 2D radiofrequency (RF) excitation pulse; an RF receiver adapted to acquire image data for each segment of a plurality of segments using a reduced phase-encoding field of view; a gradient coil assembly to generate magnetic field gradients; and one or more processors coupled to the RF transmitter, the RF receiver, and the gradient coil assembly, the one or more processors adapted to divide a targeted field of view image into the plurality of segments, with each segment of the plurality of segments having a predetermined overlap region with an adjacent segment in a phase-encoding direction; to generate an on-axis square excitation k-space coverage with two simultaneous, different magnetic field gradients in unison; to rotate the square excitation k-space by a predefined rotation angle using a gradient rotation matrix to form a rotated, off-axis square coverage in excitation k-space; to scale the rotated square excitation k-space by predefined scaling factors to generate rotated and scaled magnetic field gradients; to generate one or more first control signals to the gradient coil assembly to use a pulse sequence of the rotated and scaled magnetic field gradients; to generate one or more second control signals to the RF transmitter to generate the 2D radiofrequency (RF) excitation pulse timed with the rotated and scaled field magnetic field gradients; and to generate one or more third control signals to the RF receiver to acquire image data for each segment of a plurality of segments or a plurality of segments simultaneously.

In a representative MRI system embodiment, the one or more processors may be further adapted to determine a spatial response of the 2D radiofrequency (RF) excitation pulse; and using the spatial response of the 2D radiofrequency (RF) excitation pulse, to combine the acquired image data for each segment of the plurality of segments to generate a combined magnetic resonance image having the targeted field of view.

The benefits of the disclosed methods include more accurate imaging, which enhances or enables medical diagnoses and image-guided medical treatments; improved spatial co-registration between anatomic images and functional/physiologic/metabolic images; more robust imaging in anatomically challenging regions that have been prohibitive using conventional EPI techniques; and improved spatial resolution over a large FOV.

Numerous other advantages and features of the present invention will become readily apparent from the following detailed description of the invention and the embodiments thereof, from the claims and from the accompanying drawings.

BRIEF DESCRIPTION OF THE DRAWINGS

The objects, features and advantages of the present invention will be more readily appreciated upon reference to the following disclosure when considered in conjunction with the accompanying drawings, wherein like reference numerals are used to identify identical components in the various views, and wherein reference numerals with alphabetic characters are utilized to identify additional types, instantiations or variations of a selected component embodiment in the various views, in which:

FIG. 2A is a diagram illustrating a conventional, prior art rectangular k-space trajectory.

FIG. 2B is a diagram illustrating a square k-space trajectory.

FIG. 2C is a diagram illustrating the square k-space trajectory of FIG. 1(b) having an in-plane rotation to provide an off-axis square in k-space.

FIG. 2D is a diagram illustrating a scaling of G'y and G'z magnetic field gradient amplitudes of the rotated square k-space trajectory of FIG. 2(c) to produce a parallelogram having optimal k-space coverage without undersampling or significant oversampling.

in FIG. 11A, a water-filled phantom image acquired using a magnetic field gradient echo pulse sequence; in FIG. 11B, an experimentally obtained spatial response; and in FIG. 11C, a spatial response from Bloch equation simulations.

in FIG. 12A, a phantom image acquired using a conventional spin-echo pulse sequence; in FIG. 12B, a phantom image acquired using a conventional lipid-suppressed spin-echo EPI pulse sequence with chemical shift artifacts due to incomplete lipid suppression; and in FIG. 12C, a phantom image segment with a reduced field of view acquired using the first representative 2D RF pulse and first magnetic field gradient sequences for segment selection.

DETAILED DESCRIPTION OF REPRESENTATIVE EMBODIMENTS

Figure 1:
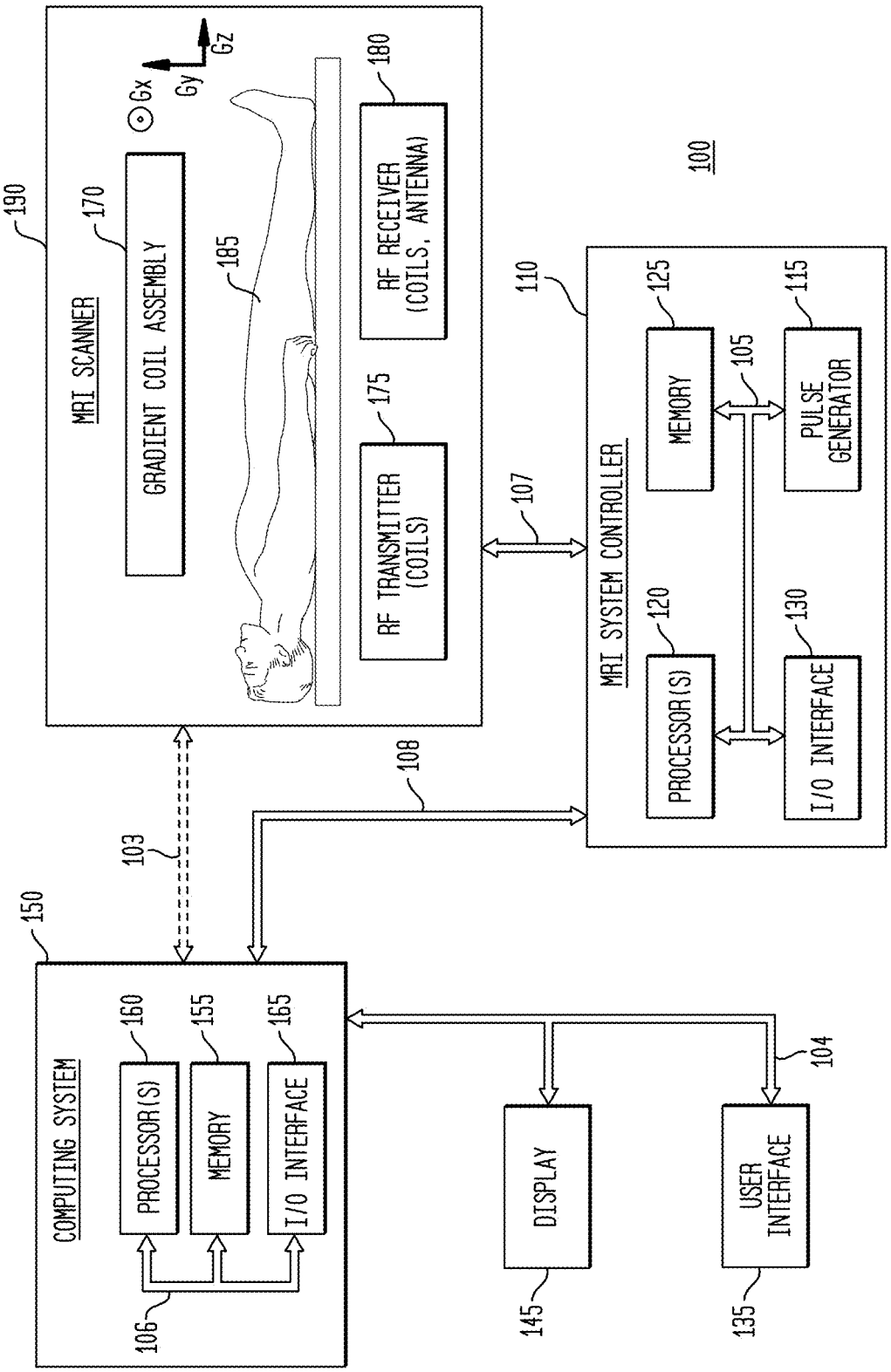
FIG. 1 is a representative MRI system embodiment.

While the present invention is susceptible of embodiment in many different forms, there are shown in the drawings and will be described herein in detail specific exemplary embodiments thereof, with the understanding that the present disclosure is to be considered as an exemplification of the principles of the invention and is not intended to limit the invention to the specific embodiments illustrated. In this respect, before explaining at least one embodiment consistent with the present invention in detail, it is to be understood that the invention is not limited in its application to the details of construction and to the arrangements of components set forth above and below, illustrated in the drawings, or as described in the examples. Methods and apparatuses consistent with the present invention are capable of other embodiments and of being practiced and carried out in various ways. Also, it is to be understood that the phraseology and terminology employed herein, as well as the abstract included below, are for the purposes of description and should not be regarded as limiting.

As mentioned above, various prior art attempts to reduce image distortion in EPI, such as increasing $\Delta k_y$ (the sampling interval in the phase-encoding direction of k-space), have met with limited success because they have resulted in other offsetting factors, such as decreased SNR. In addition, increasing $\Delta k_y$ in k-space is equivalent to reducing the field-of-view (FOV) in the image domain.

For example, in an approach named image-domain PROPELLOR EPI (iProp-EPI), a set of narrow rectangular blades was rotated and acquired sequentially in the image domain, rather than in k-space, using a reduced field of view ("FOV"). The full FOV image was then reconstructed by gridding the blades together. Though noticeable distortion reduction and a full FOV slice were achieved, iProp-EPI has several limitations. First, the image blades were acquired in a propeller-like fashion, therefore resulting in a large overlap between blades. The overlaps are helpful to boost the SNR at the center of image where the sensitivity is typically low in multi-channel receiver coils. However, the variable number of averages at peripheral region of the FOV causes uneven SNR, forming a spotlight-like artifact. Second, the scan time is also significantly prolonged due to the overlap. Third, the reduced FOV is achieved by placing the 180° refocusing slice non-parallel or orthogonal to the 90° excitation slice, similar to the ZOOM-EPI technique. This approach saturates the nearby slices, causing problems in multi-slice imaging.

Instead, and as discussed in greater detail below, the various representative embodiments decrease EPI image distortion by dividing the targeted full FOV image into multiple parallel segments, with a small overlap, along the phase-encoding direction. Each segment is sequentially or simultaneously acquired using a reduced phase-encoding FOV with a 2D RF excitation pulse. This 2D RF excitation pulse, together with a subsequent 180° refocusing pulse, is capable of simultaneous lipid suppression. The individual segments are mathematically combined to form a full-FOV image with reduced image distortion.

Instead of the solution from k-space perspective as mentioned above, the EPI distortion can also be alleviated, from an image-domain perspective, by using a reduced FOV along the phase-encoding direction. To avoid aliasing from the object outside the reduced FOV, multi-dimensional excitation methods are used to selectively excite only the region of interest, namely, the selected segment. Compared to the parallel imaging approach, one of the major advantages of this method is that it does not suffer from an SNR penalty due to g-factor.

The various representative embodiments utilize a strategy of image-domain segmented acquisition to reduce distortion in EPI, referred to as image-domain segmented EPI ("iSeg-EPI"). The various representative embodiments utilize several different components, in combination, to create a complete image having a higher spatial resolution, less image distortion, and/or a rapid image acquisition time. First, the full FOV is divided into several different regions referred to as segments, generally along the phase-encoding direction, which are typically (but do not have to be) in the same selected slice and which overlap each other by a predetermined, known amount. As a result, there is a higher spatial resolution and less image distortion for each segment. Second, each segment (region) within the selected slice is selectively excited by using a 2D RF pulse with the synchronized, concurrent application of the corresponding magnetic field gradients (G"y and G"z, described below), and the other, remaining segments within the slice are not excited (except to the extent of the predetermined overlap). It should be noted that while the RF pulse with the magnetic field gradients is referred to herein as a "2D" RF pulse, the two-dimensional slice-selection and phase-encoding are controlled by the corresponding magnetic field gradients (G"y and G"z) (discussed in greater detail below), using a single RF pulse, resulting in a "tilted" two-dimensional k-space trajectory, also discussed in greater detail below, which avoids perturbing other segments and slices. This "tilt" or rotation (by a selected or predetermined angle θ) is further controlled by scaling the two rotated magnetic field gradients (G'z and G'y) relative to each other, and when selected, the slice itself is nonetheless oriented in the transverse (x-y) plane.

Third, this selective segment excitation is repeated sequentially in a first method embodiment, for each segment of the multiple segments in the phase-encoding direction, within the selected slice, i.e., sequentially acquiring multiple segments, each using a reduced phase-encoding FOV. In a second method embodiment, the image data for multiple segments in the selected slice are simultaneously acquired, using the available techniques for multi-segment acquisition, such as using an RF receiver (antenna) having areas of sensitivity tuned to a particular segment. All segments (regions), each having a higher spatial resolution and less image distortion, are then combined into one full FOV image, without noticeable or visual discontinuity between segments, using the spatial profile of the 2D RF pulse to provide intensity weighting in the regions of overlap between the segments. Because of the use of reduced FOV for each segment, image distortion is reduced in each region, and also in the final combined image.

The regions may comprise any construct suitable for covering an image by dividing the image into a series of overlapping regions, referred to as segments, acquisition of the regions and reconstruction to a full FOV image using the methods disclosed herein. In certain embodiments, the regions comprise multiple concentric annular regions. In other embodiments, the regions comprise multiple parallel rectangular bands or segments with or without the same aspect ratio. These segments can be the same or different in shape.

The various representative embodiments comprise and employ several technical elements. First, a 2D RF excitation was developed with the following features: (a) flexibility of acquiring multiple slices for whole brain coverage within a properly selected repetition time ("TR"); (b) a relative short RF pulse width to improve the SNR by reducing the echo time ("TE"); and (c) together with a subsequent 180° refocusing pulse, lipid suppression to avoid chemical shift artifacts. Second, a rotated and scaled excitation k-space sampling method was designed for exciting the segments are acquired, enabling those segments to be acquired sequentially or simultaneously. Third, various representative embodiments provide a system and method to combine the segments into a full FOV image to eliminate the discontinuity at the junctions of neighboring segments and to reduce the image distortion of the prior art.

FIG. 1 is a representative magnetic resonance imaging (MRI) system 100 embodiment. Those having skill in the art will recognize that innumerable details have been intentionally omitted from FIG. 1, and only those features having some bearing on the claimed invention are illustrated and discussed. In addition, details of the various components are described in greater detail below. As illustrated, the MRI system 100 comprises an MRI system controller 110; an MRI scanner 190 (coupled to the MRI system controller 110 via bus or other communication link 107); a computing system 150 for image acquisition, for example (coupled to the MRI system controller 110 via bus or other communication link 108); a display 145 for MR image display (coupled to the MRI system controller 110 and to the computing system 150 via bus or other communication link 104); and one or more user interfaces 135 (coupled to the MRI system controller 110 and/or to the computing system 150 via busses or other communication links 104 respectively). The MRI system controller 110 further comprises one or more processors 120, a pulse generator 115, a memory 125, and optionally an input-output ("I/O") interface 130, coupled to each other via bus or other communication link 105. The computing system 150 also further comprises one or more processors 160, a memory 155, and optionally an input-output ("I/O") interface 165, coupled to each other via bus or other communication link 106. The MRI scanner 190 comprises a gradient coil assembly 170 (e.g., a plurality of gradient coils), one or more RF transmitters 175 (typically including one or more transmit coils, not separately illustrated), and one or more RF receivers 180 (typically including one or more receiver antennas or coils, also not separately illustrated). A human body 185 or other subject, such as a patient undergoing examination, is typically positioned within the MRI scanner 190, as illustrated. Optionally, the computing system 150 also may be coupled to the MRI scanner 190, such as through bus or link 103.

The MRI system 100 implements the various inventive methods of the present disclosure, and the various functionality described herein may be distributed between and among the MRI system controller 110, the computing system 150, and the MRI scanner 190, depending upon the selected embodiment. For example, in a representative embodiment, the MRI system controller 110 controls the MRI scanner 190 to generate the magnetic field gradients and 2D RF excitation pulse of the disclosure, and to receive the resulting MR signal. From the received MR signal, the MRI system controller 110 generates the corresponding k-space data. The computing system 150 then uses the k-space data to generate the corresponding MR image, for display on the display 145 and/or storage in the memory 155. Those having skill in the art will recognize that these functions may also be performed equivalently by the MRI system controller 110.

The operation of the MRI system 100 is controlled from the user interface 135, such as an operator console that includes a keyboard or other input device, a control panel, and is coupled to a display such as display 145, which may be implemented as known in the art. The user interface 135 communicates through a bus or link 104 with the MRI system controller 110 and provides an interface for an operator to prescribe MRI scans, display the resultant images, perform image processing on the images, and archive data and images. The user interface 135 may be implemented as known in the art and can include a keyboard, mouse, joystick, track ball, touch activated screen, light wand, voice control, or any similar or equivalent input device, and may be used for interactive input of the various parameters specifying the magnetic field gradients and 2D RF excitation pulse of the disclosure, for example.

In a representative embodiment, the computing system 150 includes one or more processors 160 which, for example, may include an image processor, a central processing unit (CPU), coupled to a memory 155, which may include a frame buffer for storing image data arrays. In an alternative embodiment, for example, the image processor may be replaced by image processing functionality on the CPU. The computing system 150 may also be connected to archival media devices, permanent or back-up memory storage or a network, such as through input-output ("I/O") interface 165. The processors 160, memory 155, and I/O interface 165 of the computing system 150, along with any other modules implemented in hardware or software (not separately illustrated), communicate with each other through electrical and/or data to connections, for example such as are provided by using a bus or backplane 106. The computing system 150 also communicates with the Mill system controller 110, such as through a bus or link 108. Data connections may be direct wired links, or may be fiber optic connections or wireless communication links, and so on.

The MRI system controller 110 includes various components in communication with each other via bus, backplane or other electrical and/or data connections 105. The bus, backplane or other data connections 105 also may be direct wired links, or may be fiber optic connections or wireless communication links, etc. In alternative embodiments, the functionality of the MRI system controller 110 and the computing system 150 may be implemented on the same computer systems or a plurality of computer systems. The MRI system controller 110 includes one or more processors 120 which, for example, also may include an image processor, a central processing unit (CPU), coupled to a memory 125, which also may include a frame buffer for storing image data arrays. In an alternative embodiment, for example, the image processor may be replaced by image processing functionality on the CPU. The MRI system controller 110 may also be connected to archival media devices, permanent or back-up memory storage or a network, such as through input-output ("I/O") interface 130.

The functionality of the MRI system controller 110 includes processing of the various parameters specifying the magnetic field gradients and 2D RF excitation pulse of the disclosure by the processor(s) 120, to provide control signals to the pulse generator 115 which, in turn, controls (also via control signals) the gradient coil assembly 170 and RF transmitter 175 to generate the magnetic field gradients and 2D RF excitation pulse of the disclosure, respectively, as discussed in greater detail below. The pulse generator 115 may alternatively be integrated into the MRI scanner 190 equipment (e.g., as part of various magnet assemblies, not separately illustrated). The MRI system controller 110 receives commands from the operator to indicate the scan sequence that is to be performed, via bus or link 104. Alternatively, in another representative embodiment, the one or more processors 160 of the computing system 150 may process the various parameters specifying the magnetic field gradients and 2D RF excitation pulse of the disclosure, and provide the corresponding magnetic field gradient (G"y and G"z) information to the MRI system controller 110 to provide the control signals to the pulse generator 115.

The pulse generator 115 operates the system components that perform (i.e., transmit) the desired pulse sequences by sending instructions, commands and/or requests (such as radio frequency (RF) waveforms) describing the timing, strength and shape of the RF pulses and pulse sequences to be produced and the timing and length of the data acquisition window for reception of the MR signal by the RF receiver 180. Not separately illustrated, the pulse generator 115 generally connects to a gradient amplifier system and produces data, namely, the magnetic field gradient waveforms, which control the timing and shape of the magnetic field gradient pulses (provided by the gradient coil assembly 170) that are to be used during the scan. Alternatively, the data for the magnetic field gradients may be provided via the various processors 120, 160, for example and without limitation. Not separately illustrated, the MRI system controller 110 also may receive patient data from a number of different sensors connected to the patient (185), such as ECG signals from electrodes attached to the patient. The MRI system controller 110 also controls the position of the patient (185) within the MRI scanner 190, such as through a patient positioning system (not separately illustrated) within the MRI scanner 190 that receives commands to move the patient table to the desired position for the selected MRI scan.

The magnetic field gradient waveforms produced by the pulse generator 115 are applied to a gradient amplifier system (e.g., comprised of Gx, Gy and Gz amplifiers) not separately illustrated, each of which powers a corresponding physical gradient coil in the gradient coil assembly 170 to produce the magnetic field gradient pulses used for spatially encoding acquired signals and more specifically to produce the magnetic field gradients of the disclosure. The gradient coil assembly 170 typically is part of a larger magnet assembly (not separately illustrated) that includes a polarizing magnet, and may include a whole-body RF coil, surface or parallel imaging coils, and so on, as known in the art. The coils of the RF transmitter 175 (coil assembly) may be configured for both transmitting and receiving or for transmit-only, and in the latter case, the RF receiver 180 (also typically an antenna or coil assembly) is also included. A patient or imaging subject 185 is positioned within the MRI scanner 190 as illustrated. The pulse generator 115 and/or processor(s) 120 may be coupled to a transceiver (not separately illustrated) in the MRI system controller 110 which produces pulses that are amplified by an RF amplifier (not separately illustrated) and coupled to the RF transmitter 175 (which may be replaced or augmented with surface and/or parallel transmit coils) to provide the 2D RF excitation pulse of the disclosure. The resulting signals emitted by the excited nuclei in the patient may be sensed by the RF receiver 180 (or the combination of RF transmitter and receiver 175, when so configured).

The received MR signals are usually amplified, demodulated, filtered and digitized in the receiver section of the RF receiver 180, and provided to the processor(s) 120 or processor(s) 160 or other signal processing components (not separately illustrated) or stored in a memory 125, 155, such as in a reception k-space format. MRI data is typically collected in a Fourier space known in imaging as "k-space", a reciprocal space connected to real space via a Fourier transformation. Each MR signal is encoded with a particular spatial frequency using slice selection, frequency and phase-encoding magnetic field gradient pulses, and multiple such MR signals are digitized and stored in the reception k-space for later reconstruction as an image. Typically, frames of data corresponding to MR signals are stored temporarily in the memory 125, 155 until they are subsequently transformed to create images.

The processor(s) 120 or processor(s) 160 are programmed or otherwise configured to perform the inventive methodology and signal processing of the present disclosure, as described in greater detail below, to form a composite image from a plurality of segment images. In addition, the processor(s) 120 or processor(s) 160 may include an array processor (not separately illustrated) that employs a known transformation method, most commonly an inverse Fourier transform, to create images from the MR signals. These images may be generated by either the MRI system controller 110 or the computing system 150 and are typically stored in memory 125, 155, and also may be archived in long term storage or further processed by the processor(s) 120 or processor(s) 160 and conveyed for presentation on the display 145.

The MRI system 100 may be equipped with an array of RF receiver coil elements, in which each coil element separately detects the MRI signals. Such RF receiver coil arrays are well-known in the art and include whole body arrays as well as organ-specific arrays, such as head coil arrays, cardiac coil arrays, and spine coil arrays. Many arrays of coil elements are designed to be compatible with parallel imaging techniques, such that each coil element has a different spatial sensitivity profile from other coil elements in the array.

FIG. 2A is a diagram illustrating a conventional, prior art rectangular excitation k-space trajectory traversed during a 2D RF pulse, and shows that an on-axis rectangular k-space trajectory is first designed and then rotated off-axis to achieve a tilted excitation, resulting in inadequate k-space coverage in some regions 50 (red arrow), and unnecessary coverage in other regions 55 (gray arrow).

FIG. 2B is a diagram illustrating a square excitation k-space trajectory 65 traversed during the 2D RF pulse described in this disclosure, adequately sampling the central circular region 60. FIG. 2C is a diagram illustrating the square k-space trajectory of FIG. 1(b) having an in-plane rotation to provide an off-axis square in k-space. FIG. 2D is a diagram illustrating a scaling of G'y and G'z magnetic field gradient amplitudes of the rotated square k-space trajectory of FIG. 2C to produce a parallelogram having improved k-space coverage without undersampling or significant oversampling. A 2D RF excitation pulse for reduced FOV imaging was designed using tilted excitation by rotating the trajectory of excitation k-space in the (ky, kz)-plane, where ky and kz denote the phase-encoding and slice-selection directions, respectively. In the various representative embodiments, the k-space trajectory begins with a square k-space traversal strategy 65 shown in FIG. 2B, i.e., selecting phase-encoding and slice-selection magnetic field gradient amplitudes, Gy and Gz, to have an on-axis square excitation k-space trajectory, followed by an in-plane rotation 70 (e.g., 60° clockwise), resulting in an off-axis square in k-space shown in FIG. 2C. Such a k-space rotation of θ degrees (clockwise), and corresponding modification of the original Gy and Gz magnetic field gradient amplitudes, may be calculated as an interim result of G'y and G'z magnetic field gradient amplitudes using a rotation matrix (Equation 2):

$$\begin{bmatrix} G'y \\ G'z \end{bmatrix} = \begin{bmatrix} \cos\theta & \sin\theta \\ -\sin\theta & \cos\theta \end{bmatrix} \begin{bmatrix} Gy \\ Gz \end{bmatrix}.$$

Those having skill in the art will recognize that the two sin θ functions will be transposed in the matrix for counter-clockwise rotations and are considered equivalent herein.

The rotated square excitation k-space is then compressed (or stretched) along the phase-encoding direction (or the slice direction) because the 2D selection region often is thicker than the slice thickness. This is performed by scaling the phase-encoding magnetic field gradient amplitude relative to that of the slice-selection magnetic field gradient without the need of redesigning new magnetic field gradient waveforms. As illustrated in FIG. 2D, the interim G'y and G'z magnetic field gradient amplitudes are then scaled, respectively multiplied by scalar factors a and b (which may be fractional), to provide the actual G"y and G"z magnetic field gradient amplitudes which will be utilized in the ss-EPI (Equations 3 and 4): G"y=a·G'y and G"z=b·G'z. As illustrated in FIG. 2D, the rotated k-space square has been deformed to a parallelogram, enclosing the desired elliptical excitation k-space coverage with the shorter axis along the phase-encoding direction to select a segment, and the long axis along the slice direction to select a thin slice, achieving an improved k-space coverage, avoiding significant over-sampling (75) and under-sampling (80) occurring along the diagonal directions of previous designs shown in FIG. 2A. It should be noted that having now been rotated and scaled, the first magnetic field gradient (G"y) and the second magnetic field gradient (G"z) may no longer be orthogonal.

After this scaling, the desired k-space (the color background with the elliptical region) is properly covered (FIG. 2D), while avoiding the diagonal sampling problem encountered using a simple rotation (shown in FIG. 2A). As mentioned above, the various processors 120, 160 (or other components of the MRI system controller 110 or the computing system 150) typically perform this k-space manipulation (rotation, scaling) to generate the various parameters specifying the actual G"y and G"z magnetic field gradients, waveforms, and 2D RF excitation pulse of the disclosure, which are then provided as control signals to the pulse generator 115, to control the RF transmitter 175 and gradient coil assembly 170 which then generate the specified 2D RF excitation pulse and G"y and G"z magnetic field gradients, respectively.

Figure 3A:
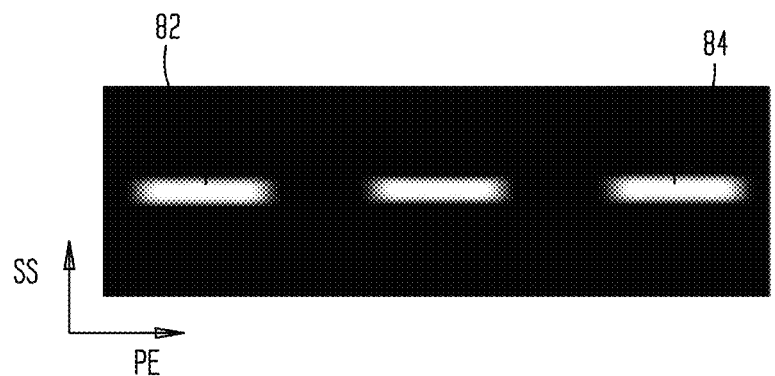
FIG. 3A is a diagram illustrating side bands in the selected image slice along the slice-selection magnetic field gradient limiting the minimum field of view along the phase-encoding direction of conventional, prior art EPI.

FIG. 3A is a diagram illustrating side bands in the selected image slice limiting the minimum field of view along the phase-encoding direction of conventional, prior art EPI. Two-dimensional radiofrequency (RF) pulses have a number of applications, such as imaging with restricted FOV and navigator echoes for monitoring motion. A 2D spatially selective pulse typically consists of a train of sub-pulses simultaneously played out with magnetic field gradient waveforms on two independent axes, enabling traversal of a 2D excitation k-space raster. The extent of the k-space coverage determines the 2D spatial selection profile, including both the selection width and transition regions. Although many magnetic field gradient waveforms have been proposed, EPI waveforms remain most popular. Typically, the bipolar magnetic field gradient waveform resembling to an EPI readout is use for slice selection (i.e., the kz-direction) and the blipped magnetic field gradient for spatial section along the phase-encoding direction (i.e., the ky-direction). With this approach, the spatial response along the ky-direction produces side bands 82 and 84 as shown in FIG. 3A, however, due to the low sampling rate by the blips. The separation between the main and the side bands imposes a limit on the minimum full FOV along the phase-encoding direction. An added benefit of this tilting approach is a shorter pulse width and a more even distribution of the gradient load among the physical gradient axes.

Figure 3B:
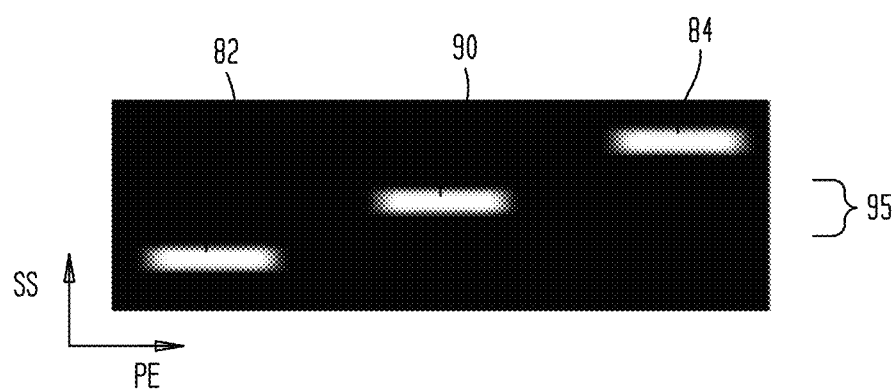
FIG. 3B is a diagram illustrating rotation of the side bands out of the selected image slice along the slice-selection magnetic field gradient having the desired main band for a segmented image.

FIG. 3B is a diagram illustrating prior art rotation of the side bands out of the selected image slice along the slice-selection magnetic field gradient having the desired main band for a segmented image. As discussed above, to place the side bands 82, 84 away from the slice and phase-encoding directions, the k-space square was rotated with a predefined tilting angle (e.g., 60°) (FIG. 2C). Because of the circular geometry, the rotation did not affect the central k-space coverage of the selected slice 95. The selected slice 95, then, has the main band 90, and potentially interfering side bands 82, 84 have been displaced into other slices. As discussed in greater detail below, the main band will be contained in a selected segment 200 in FIG. 5, and adjacent segments in the selected slice 95 have not been saturated or otherwise significantly perturbed in a way which would interfere with additional signal acquisitions from these segments.

Creation of the 2D RF excitation radiofrequency (RF) pulse and G"y and G"z magnetic field gradients, according to the various representative embodiments, generally involves the following steps. First, as mentioned above, a square excitation k-space coverage (FIG. 2B) is created by utilizing two simultaneous, but different magnetic field gradients (e.g., Gy and Gz) in unison. Although the specific example utilizes EPI-type magnetic field gradient waveforms, other types of magnetic field gradient waveforms, such as spiral magnetic field gradient waveforms, can also be used. Second, the square k-space coverage in FIG. 2B, as mentioned above, is rotated with a pre-defined rotation angle (e.g., 60°) by using the gradient rotation matrix in an MRI system 100 (e.g., determined by the one or more processors 120), as described above, resulting in an off-axis square coverage in k-space (FIG. 2C). The rotation angle determines the degree to tilt the excitation side bands along the phase-encoding direction. With this rotation, the original magnetic field gradient waveforms Gy and Gz in FIG. 2A are mixed according to the rotation matrix, and prior to feeding to the actual physical magnetic field gradients (G"y and G"z) (i.e., before generating the physical magnetic field gradient waveforms), the rotated magnetic field gradients G'y and G'z are scaled to produce an elliptical excitation k-space coverage (FIG. 2D) whose aspect ratio is dictated by the slice thickness (i.e., a longer axis in elliptical excitation k-space for a thinner slice) and the excited segment width (i.e., a shorter axis in elliptical excitation k-space for a wider band) along the phase-encoding direction. After the scaling (to provide G"y and G"z magnetic field gradient amplitudes) the off-axis square k-space coverage (FIG. 2C) has been deformed to a parallelogram (FIG. 2D) enclosing the desired elliptical k-space coverage with the shorter axis along the phase-encoding direction to select a segment, and the longer axis along the slice direction to select a thin slice.

Figure 4:
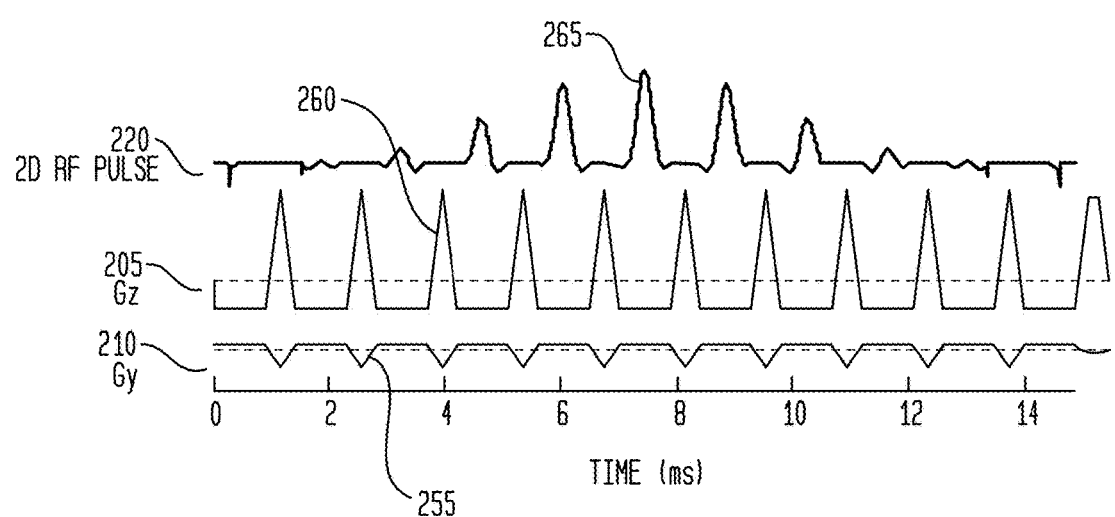
FIG. 4 is a diagram illustrating a first representative 2D RF pulse and first magnetic field gradient sequences for slice and segment selection.
Figure 5:
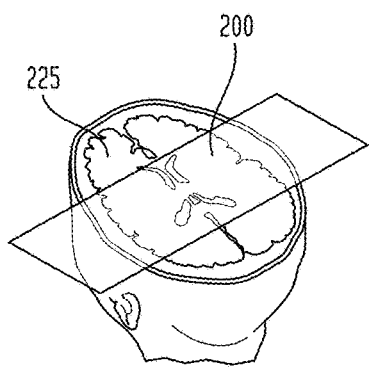
FIG. 5 is a diagram illustrating a selected segment within a selected slice along the slice-selection magnetic field gradient.
Figure 6:
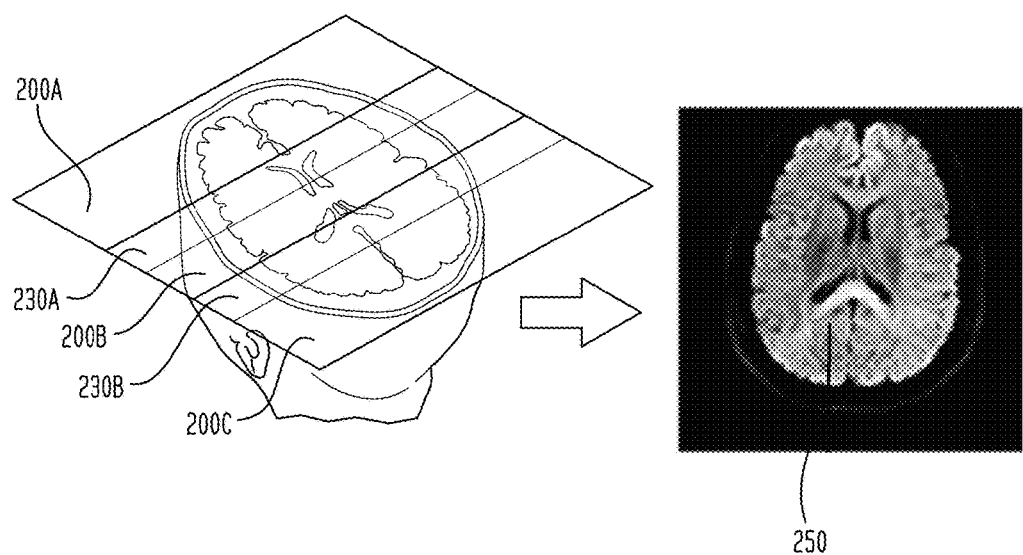
FIG. 6 is a diagram illustrating a plurality of overlapping selected segments along the phase-encoding direction, but all within a selected slice along the slice-selection magnetic field gradient and a resulting reconstructed image.
Figure 7:
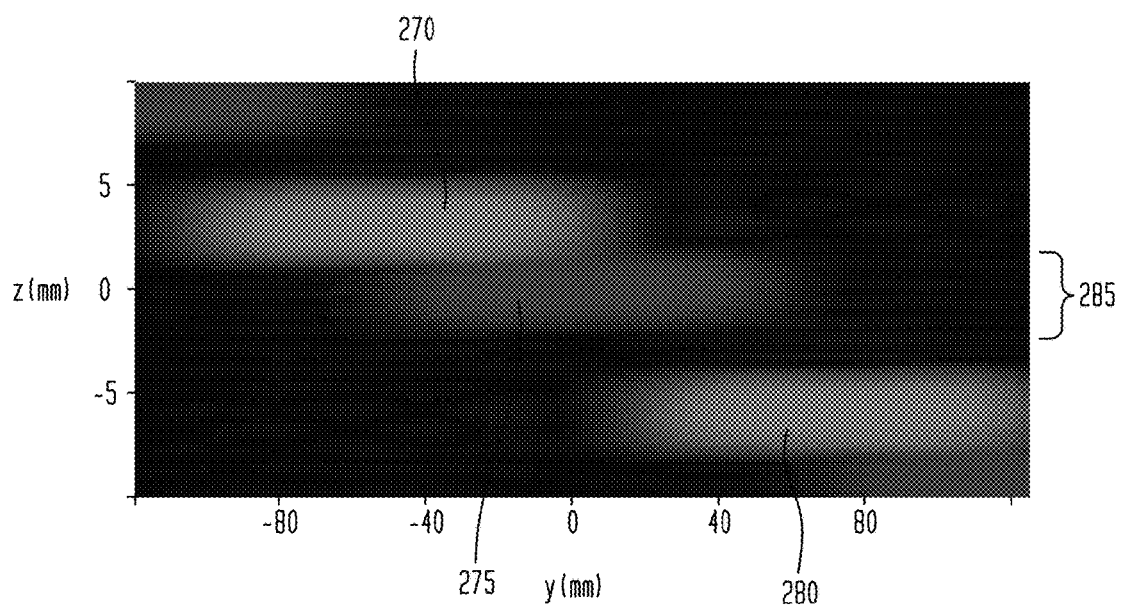
FIG. 7 is a diagram illustrating a simulated image created using the first representative 2D RF pulse envelope and first magnetic field gradient sequences for segment selection.

FIG. 4 is a diagram illustrating a first representative 2D RF pulse 220 and first magnetic field gradient sequences Gz 205 and Gy 210 (illustrated prior to rotation and scaling) for slice selection and segment selection (in the phase-encoding direction). As used herein, it should be understood that reference to the "first magnetic field gradient sequences" means and includes the scaled and rotated versions (to produce G"z and G"z, as discussed above) provided by the MRI system 100 from, for example, the rotation and scaling of the magnetic field gradients Gz 205 and Gy 210, also as discussed above. FIG. 5 is a diagram illustrating a selected segment within a selected slice along the slice-selection magnetic field gradient. FIG. 6 is a diagram illustrating a plurality of overlapping selected segments within a selected slice along the slice-selection magnetic field gradient and a resulting reconstructed image. FIG. 7 is a diagram illustrating a simulated image creating using the first representative 2D RF pulse envelope and first magnetic field gradient sequences for segment selection, showing the location of water (blue) and lipid (yellow) signals.

With the above excitation k-space coverage strategy, a 2D RF excitation pulse (having envelope 265) using EPI magnetic field gradient waveforms 255, 260 was developed. A fly-back EPI magnetic field gradient was used along the slice selection direction to eliminate the sensitivity to RF/gradient timing errors that can result in Nyquist ghosts (or N/2 ghosts) at the middle of two excitation bands (this is analogous to the Nyquist ghost caused by a bipolar readout magnetic field gradient in single-shot EPI). The width of the fly-back gradient lobes was minimized by utilizing the maximal slew-rate allowed by the Reilly's curve. Each RF sub-pulse, which determines the segment selection along the phase-encoding direction, was designed using a linear-phase Shinnar-Le Roux (SLR) method with a time-bandwidth product (T$\Delta$B) of 3 (i.e., bandwidth=4.3 kHz, and pulse width=0.7 ms) and both pass- and stop-band ripples of 1%. Eleven sub-pulses separated with an inter-pulse time delay of 0.7 ms in between (to allow gradient fly-back) were concatenated under an envelope pulse 265, which determines the slice selection. The envelope pulse 265 was designed using a linear-phase SLR method with the following parameters: T$\Delta$B=3, pulse width=14.7 ms, in/out of slice ripple=1%, and flip angle=90°. The inter-sub-pulse spacing of 1.4 ms places the lipid signal (yellow areas in FIG. 7) about 1.1 times the slice thickness away from the water profile (blue areas in FIG. 7). Simultaneous lipid suppression with the 2D RF pulse was achieved, as follows. The duration between any two consecutive sub-pulses was chosen as 1.4 ms at 3 Tesla (note that this time duration needs to be adjusted to match the lipid-water separation at a specific magnetic field strength) so that the lipid signals 270, 280 (yellow areas in FIG. 7) were shifted completely outside the water profile 275 (blue areas in FIG. 7). Because of this large shift (~3 mm), the lipid signal was not refocusable by the subsequent 180° pulse in a spin-echo EPI pulse sequence due to the opposite spatial shift (~-1 mm) arising from the chemical shift along the slice-selection direction (note that this opposite spatial shift was intentionally introduced by reversing the polarity of the slice-selection magnetic field gradient for the 180° refocusing RF pulse with respect to that for the 90° 2D RF excitation pulse). In contrast, the 180° pulse adequately refocuses the water signals in the targeted slice 285 (central blue area in FIG. 7). The simulation result to confirm the performance of the 2D RF pulse is illustrated in FIG. 7, which showed ~60° tilting of the spatial response profiles in the (y,z)-plane, as designed.

The 2D spatial response w(y,z) of the 2D RF pulse, as well as the different responses between water and lipids, was analyzed using Bloch equations with customized simulation programs written in Matlab (Mathworks, Natick, Mass.). The spatial response function w(y,z) was subsequently used in image reconstruction. The 2D RF pulse was implemented in a commercial single-shot spin-echo EPI pulse sequence capable of diffusion imaging (General Electric Healthcare, Waukesha, Wis.) for experimental demonstrations.

It should be noted that using the magnetic field gradients (G"y and G"z) of the present disclosure, any appropriate 2D RF pulse may be utilized, including classical or prior art 3D RF pulses with their existing pulse parameters, provided the 2D RF pulse sequence is coordinated with the concurrent application of the corresponding magnetic field gradients (G"y and G"z) in accordance with this disclosure.

Referring to FIGS. 5 and 6, as mentioned above, and using the 2D RF pulse 220 and first magnetic field gradient sequences discussed above, k-space data (as rotated and scaled as discussed above) for a selected segment 200 may be acquired for a selected slice 225. As illustrated in FIG. 6, the process may be repeated to acquire k-space data for each segment 200A, 200B, and 200C. As mentioned above, each such segment 200 has a predetermined amount of overlap (e.g., 10-15% of the segment width) with the adjacent segment, illustrated as overlapping region 230A (of segments 200A and 200B) and overlapping region 230B (of segments 200B and 200C). As described in greater detail below, the overlapping segments 200A, 200B, and 200C are then combined to produce a resulting seamless, single image 250.

Image reconstruction was performed using customized software written in Matlab (Mathworks, Natick, Mass.). Each segmented image $S_i(y)$ (i=1, 2, 3, . . . n) was reconstructed individually using a commercially available reconstruction algorithm. In accordance with the representative embodiments, however, the intensity of $S_i$ is weighted or modulated by the RF excitation (spatial response) profile along the phase-encoding direction $w_i(y)$ (illustrated as representative RF excitation (spatial response) profiles 305A, 305B, and 305C in FIG. 8) according to Equation 5:

$$S_i(y)=S(y)w_i(y), i=1, 2, 3 \ldots n$$

where n is the total number of segments, $w_i(y)$ is the 2D RF pulse spatial response along the phase-encoding direction (obtainable from a Bloch simulation), and i represents the ith segment. For example, using the representative RF excitation profiles 305A, 305B, and 305C illustrated in FIG. 8, oriented in the phase-encoding direction, the spatial response profiles have a comparatively lower amplitude (roll-off) in the regions of overlap 230, toward the periphery of each segment in the phase-encoding direction. The weighting function 305 $w_i(y)$ can be obtained from the Bloch equation simulation for the ith segment. This non-uniform weighting effect and the overlapping effects should be removed to recover an original image S(y). Representative Bloch equations for the simulation, include, for example and without limitation: with no relaxation (that is, both $T_1$ and $T_2 \to \infty$) the above equations simplify to:

$$\frac{dM_x(t)}{dt} = \gamma(M(t) \times B(t))_x; \quad \frac{dM_y(t)}{dt} = \gamma(M(t) \times B(t))_y; \text{ and}$$

$$\frac{dM_z(t)}{dt} = \gamma(M(t) \times B(t))_z;$$

which simplify in vector notation to $$\frac{dM(t)}{dt} = \gamma(M(t) \times B(t)),$$

where $M(t)=(M_x(t), M_y(t), M_z(t))$ is the nuclear magnetization, $\gamma$ is the gyromagnetic ratio and $B(t)=(B_x(t), B_y(t), B_0+\Delta B_z(t))$ is the effective magnetic field experienced by the nuclei in the rotating reference frame. When the relaxation effects are not ignored, representative Bloch equations can also be shown in matrix-vector notation as:

$$\frac{d}{dt}\begin{bmatrix} M_x \\ M_y \\ M_z \end{bmatrix} = \begin{bmatrix} -\frac{1}{T2} & \gamma B_z & -\gamma B_y \\ -\gamma B_z & -\frac{1}{T2} & \gamma B_x \\ \gamma B_y & -\gamma B_x & -\frac{1}{T1} \end{bmatrix} \begin{bmatrix} M_x \\ M_y \\ M_z \end{bmatrix} + \begin{bmatrix} 0 \\ 0 \\ \frac{M_0}{T1} \end{bmatrix}.$$

Those having skill in the art will understand how to perform a Bloch simulation to obtain the spatial response profiles of the 2D radiofrequency (RF) excitation pulse, for example. Any known and publicly available Bloch simulations may be utilized equivalently to obtain the spatial response profiles of the 2D radiofrequency (RF) excitation pulse. For example and without limitation, Bloch simulators are available for download at the following Internet addresses: http://mrsrl.stanford.edu/~brian/blochsim/ (with embedded links to corresponding Matlab code); http://pubs.rsna.org/doi/full/10.1148/radiographics.27.6.e27; and https://github.com/neji49/bloch-simulator-python. Instructions for developing a Bloch simulation are also known and publicly available, such as at http://www-mrsrl.stanford.edu/~brian/bloch/. The methodology to determine spatial response profiles, such the spatial response profile of the 2D radiofrequency (RF) excitation pulse used herein, are also known and illustrated in Bernstein, King and Zhou, *Handbook of MRI Pulse Sequences*, Academic Press, 1$^{St}$ ed. (Sep. 21, 2004); ISBN-10: 0120928612; ISBN-13: 978-0120928613. Each of these references, and any and all linked information and code, are incorporated herein by reference in their entireties with the same full force and effect as if set forth in their entireties herein.

It should be noted that the MRI scanner 190 and/or MRI system controller 110 have the spatial coordinates of each segment, generally within header information, allowing each segment image to be properly positioned with respect to the other segment images, to create the final, combined full FOV image. The final full FOV image S(y) was then created by combining image data for the plurality of segments using a least squares solution (Equation 6):

$$S(y) = \sum_{i=1}^{n} w_i(y) S_i(y) \bigg/ \sum_{i=1}^{n} w_i^2(y)$$

also where n is the total number of segments, $w_i(y)$ is the 2D RF pulse spatial response along the phase-encoding direction (obtainable from a Bloch simulation), and i represents the ith segment.

Two experimental studies were carried out on a 3 Tesla GE MR750 scanner (General Electric Healthcare, Waukesha, Wis.) equipped with an advanced gradient system (maximal gradient amplitude=50 mT/m, slew-rate=200 T/m/s). In the first experiment, diffusion-weighted images from a healthy human brain were acquired using a 32-channel head coil (Nova Medical, Inc., Wilmington, Mass.) in 1 (i.e., full FOV), 2, and 3 segments along the anterior-posterior direction, respectively. For the full FOV (22×22 cm$^2$) acquisition, a commercial ss-EPI diffusion pulse sequence was used with a matrix size of 128×128. For the experiments with 2-3 segments, each segment width was 12.4 cm (128×72 matrix) and 8.4 cm (128×48 matrix), respectively, with the overlaps to give a total FOV of 22 cm along the phase-encoding direction. Other acquisition parameters were b=1000 s/mm$^2$, slice thickness=3 mm, TR/TE=4500/69.7 ms, and number of averages=4 (NEX=4). In the second experiment, the proposed method was demonstrated in the abdomen of a healthy human volunteer to obtain high-resolution diffusion-weighted images with reduced distortion using a 32-channel phased-array coil. Images with one, two and three segments were acquired over a FOV of 34 cm$^2$ and the key acquisition parameters are described below with reference to FIG. 10.

Figure 8:
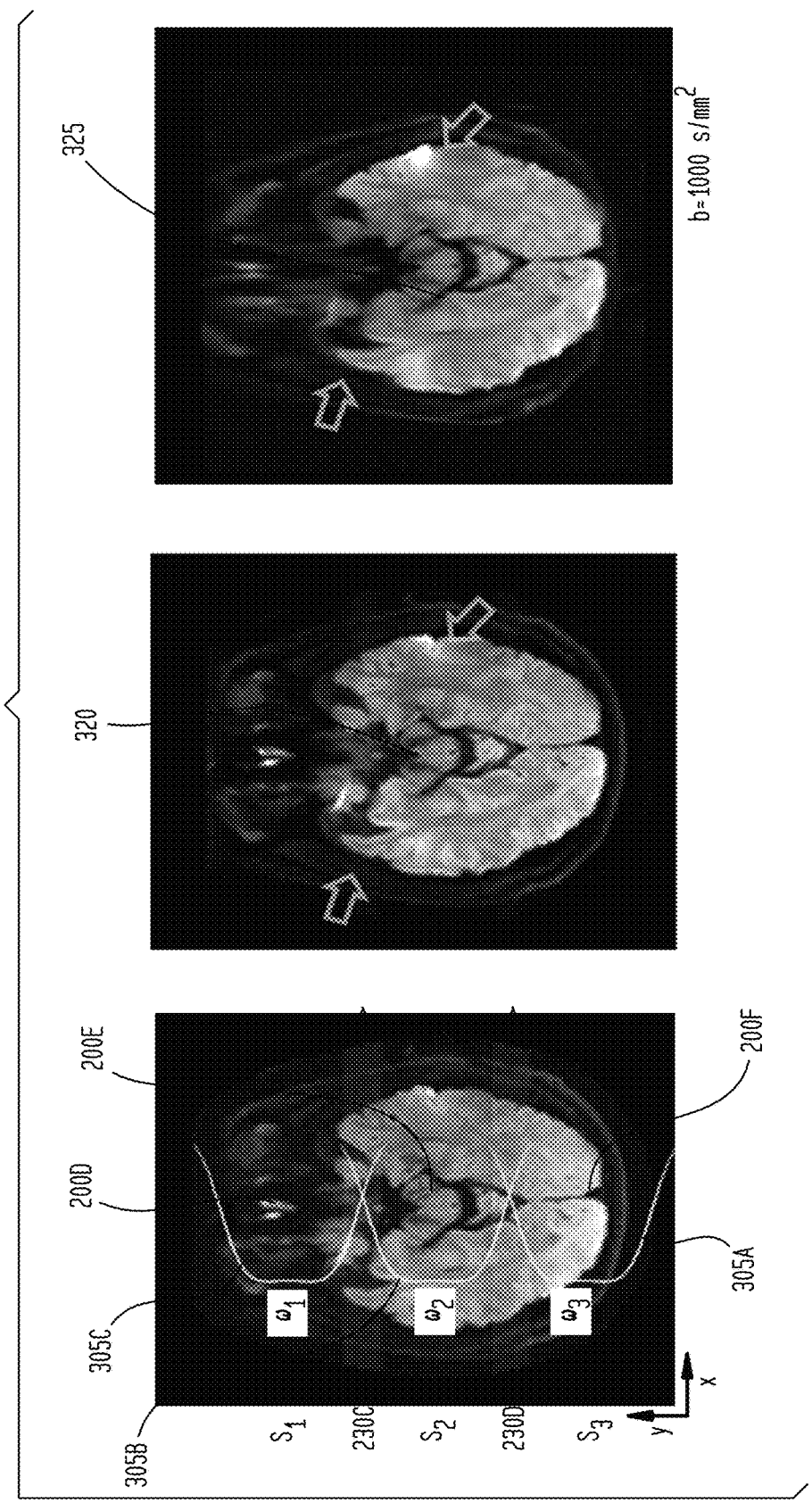
FIG. 8 is a set of images illustrating: (a) three individual segments of a diffusion-weighted brain scan; (b) a combined diffusion image from the three segments in (a); and (c) a full FOV image acquired using conventional EPI.

FIG. 8 is a set of images illustrating: (a) three individual segments 200D, 200E, 200F of a diffusion-weighted brain scan; (b) a combined diffusion image 320 from the three segments in (a); and (c) a full FOV image 325 acquired using conventional diffusion-weighted EPI. FIG. 8 (a) shows three individual segments of a diffusion-weighted brain scan with RF excitation profiles 305A, 305B, and 305C (yellow)

superimposed on the corresponding segment 200D, 200E, 200F. The overlap (transition) regions 230C, 230D (red brackets) between segments 200D, 200E, 200F and the inter-segment discontinuity are clearly visible using this simple "stacking" combination. In accordance with the representative embodiments, FIG. 8(b) shows a combined diffusion image 320 from the three segments 200D, 200E, 200F using the inventive method described by Equation 6, with the inter-segment discontinuity completely removed and indiscernible. Also as shown in FIG. 8(b), the distortion and signal pile-up are effectively reduced when compared to the full FOV image 325 in FIG. 8(c), which was acquired using a conventional method with one segment.

Figure 9:
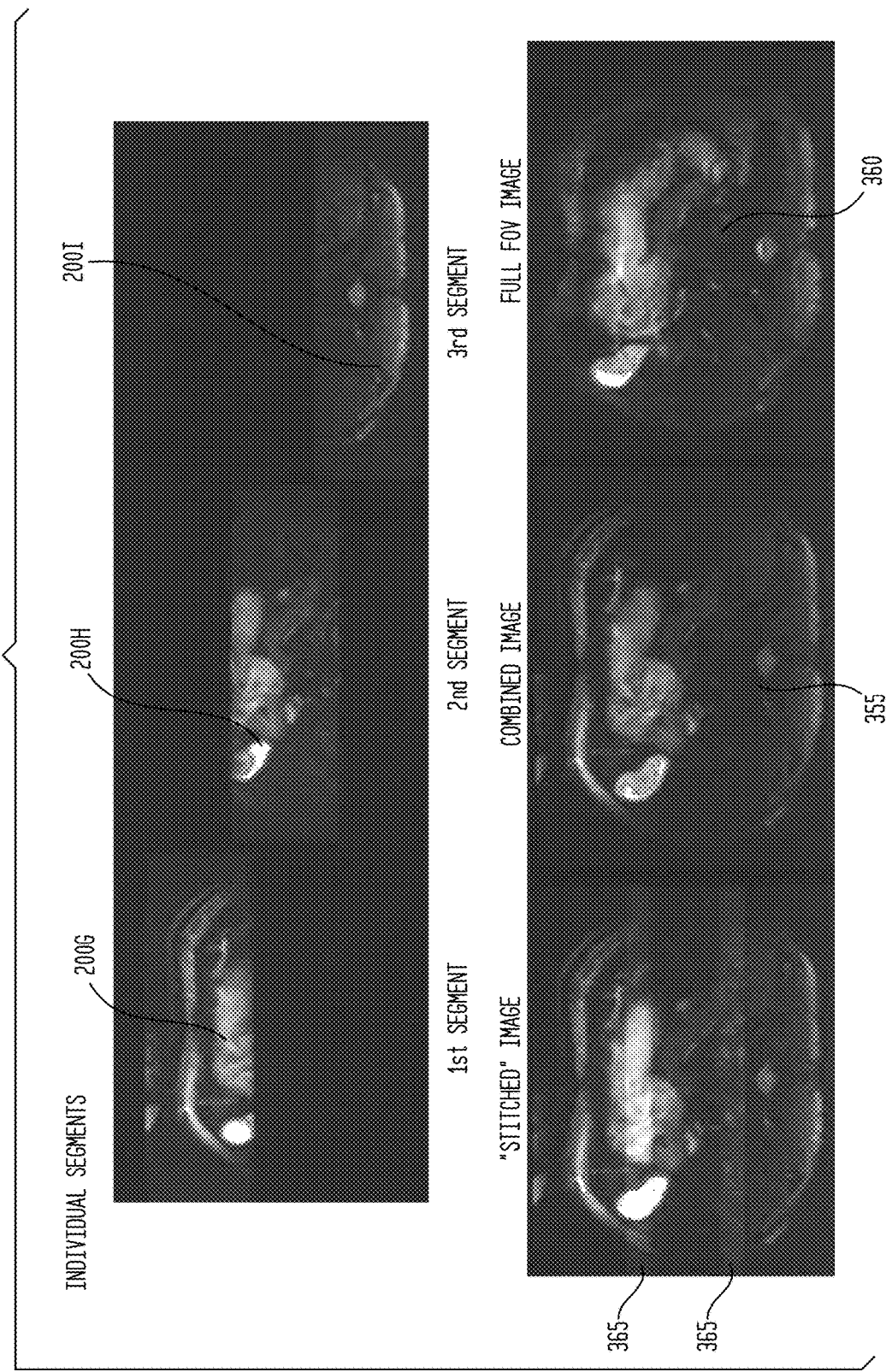
FIG. 9 is (a) a set of images illustrating three individual segments acquired from the abdomen of a human subject in an axial plane; and (b) a set of images illustrating a stacked image, a combined image, and a single-shot EPI image using a single segment.

Results from the second experiments are shown in FIG. 9 where the performance of the disclosed method for body diffusion imaging is demonstrated. FIG. 9 is (a) a set of images illustrating three individual segments 200G, 200H, 200I acquired from the abdomen of a human subject in an axial plane, each with a small overlap to cover the entire abdomen in an axial plane; and (b) a set of images illustrating a stacked image 350, a combined image 355 obtained using Equation 6, and an ss-EPI image 360 using a single segment. In the stacked image 350, the discontinuity is clearly visible in the overlapping regions 365 between the neighboring segments 200G, 200H, 200I. The middle image 355 in the bottom row (b) was reconstructed using the representative first method (Equation 6), where the transition bands are eliminated. Additionally, the inventive image reconstruction effectively removed the discontinuity between the segments (middle image 355 compared to the stacked image 350). The right image 360 of the bottom row (b) was acquired using a single segment (i.e., single-shot EPI) as a reference for comparison. The inventive image reconstruction effectively reduced distortion, and the reduction can be appreciated by comparing the combined image 355 in the middle of the bottom row (b) with the reference image 360 on the right of the bottom row (b). The imaging parameters were TR/TE=2000/57 mx, b=800 s/mm$^2$, FOV=34 cm, in-plane resolution=2.65×2.65 mm$^2$, and slice thickness=4 mm.

Figure 10:
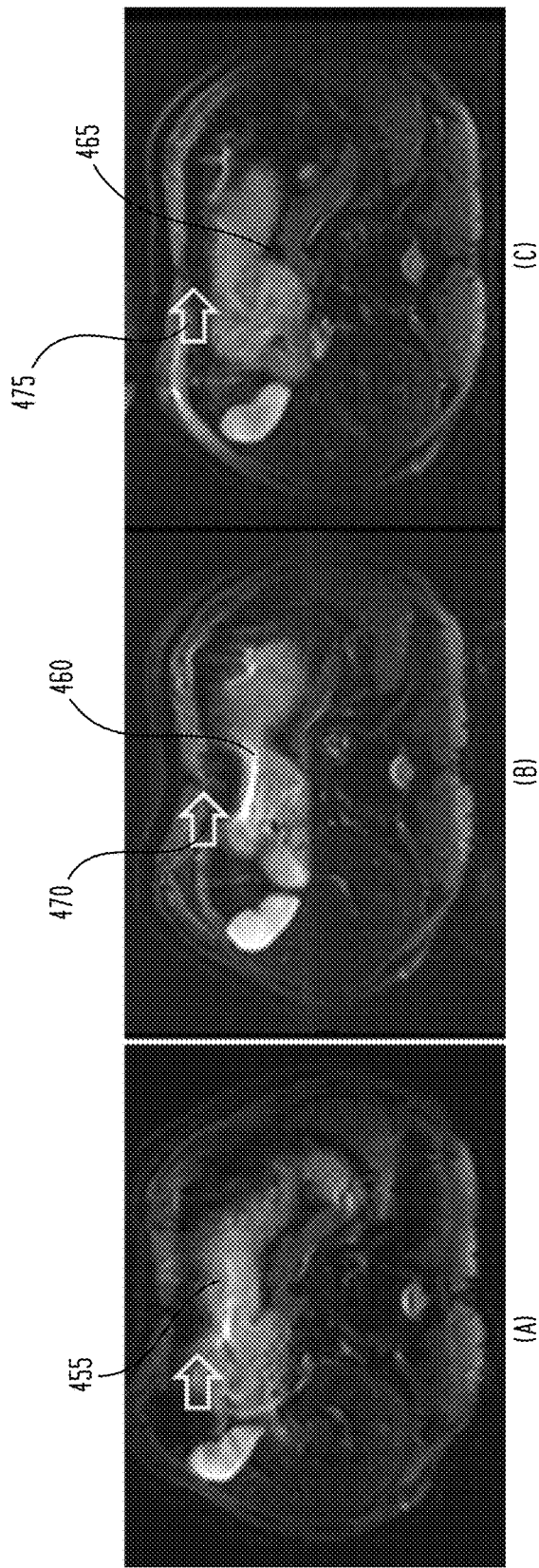
FIG. 10 is a set of body diffusion images illustrating progressive reduction of image distortion with: (a) one segment; (b) two segments; and (c) three segments.

FIG. 10 is a set of body diffusion images illustrating progressive reduction of image distortion with: (a) one segment 455; (b) two segments 460; and (c) three segments 465. The various representative embodiments, also referred to as image domain segmented EPI ("iSeg-EPI") were utilized for body diffusion images, where image distortion was progressively reduced as the number of segments were increased from one segment (a), to two segments (b), and to three segments (c), particularly in regions away from the center of the FOV, as indicated by the arrows 470, 475. The imaging parameters were TR/TE=2000/57 ms, FOV=34 cm, in-plane resolution=2.65×2.65 mm$^2$, and slice thickness=4 mm.

The various representative embodiments do not involve more complicated image reconstruction than otherwise required in MR imaging, other than using a weighting function w, which can be obtained through a Bloch simulation, as described above. This method is particularly useful when multiple signal averages are needed. Instead of using multiple averages to repeatedly acquiring the same information, these "averages" can be redistributed to acquire individual segments to reduce image distortion and signal pile-up. In situations where multiple averages are not needed, the various representative embodiments can lengthen the scan time. The increase in scan time, however, is not more than that in a conventional multi-shot EPI acquisition. Most importantly, the issue with the lengthened time can be completely eliminated using simultaneous multi-segment imaging, in a similar fashion to simultaneous multi-slice imaging, to be described in detail below in reference to FIG. 15.

In summary, an image domain segmented EPI technique with 2D RF excitation has been demonstrated to effectively reduce the image distortion and/or increase the spatial resolution. Specifically for diffusion scans, three segments appear to be adequate to reduce image distortion while maintaining an acceptable acquisition time. Other numbers of segments, however, are also possible using the same technique disclosed herein and are within the scope of the disclosure.

Additional experiments were performed to demonstrate the efficacy and superiority of the rotated and scaled k-space and corresponding first representative 2D RF pulse 220 and first magnetic field gradient sequences. All experimental evaluations of the 2D RF pulse were conducted on a 3 Tesla MR750 scanner made by the above vendor. To compare the simulated spatial response of the 2D RF pulse with experimental data, the 2D RF pulse was incorporated into an EPI sequence with its readout magnetic field gradient changed to the slice-selection direction, producing an image showing the 2D excitation profile in a plane defined by the phase-encoding and slice-selection axes. Four experiments were conducted to demonstrate the performance of the disclosed 2D RF pulse design. In the first experiment, a spherical uniform water phantom was used to show the agreement between the simulated spatial response of the 2D RF pulse and the experimentally obtained spatial profile. In the second experiment, a phantom containing water, fat, and an orange was imaged to demonstrate the ability to achieve a reduced FOV without suffering from aliasing artifacts while adequately suppressing lipids using the disclosed 2D RF pulse. In the last two experiments, the 2D RF pulse was used to obtain images from the human brain stem and kidney in focused areas.

Figure 11C:
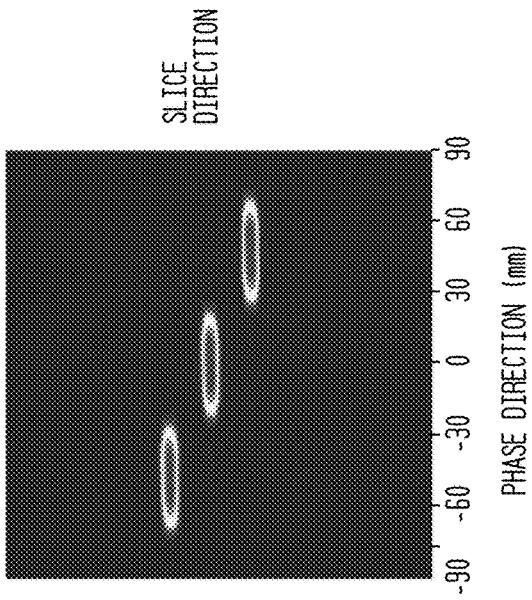
FIGS. 11A, 11B and 11C (collectively referred to as FIG. 11) are a set of images illustrating.
Figure 11B:
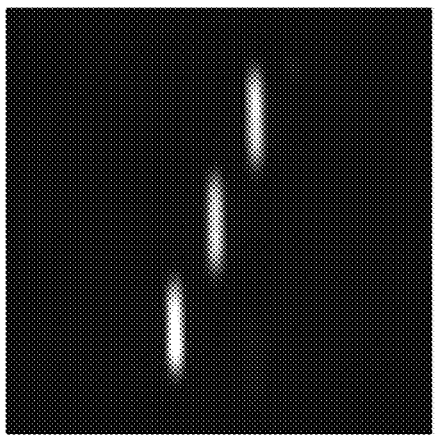
Figure 11A:
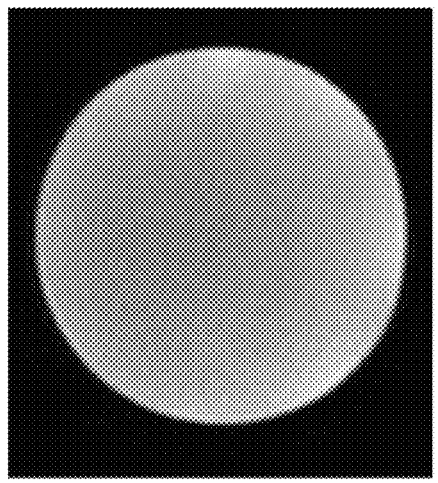

FIGS. 11A, 11B and 11C are a set of images illustrating: in FIG. 11A, a water-filled phantom cross-sectional image was acquired using a magnetic field gradient echo pulse sequence in the first experiment; in FIG. 11B, an experimentally obtained spatial response; and in FIG. 11C, a spatial response from Bloch equation simulations. The experimentally obtained spatial response of the 2D RF pulse is shown in FIG. 11B, and excellent agreement was observed between this experimental response and the theoretical response obtained from Bloch equation simulation (FIG. 11C).

Figure 12C:
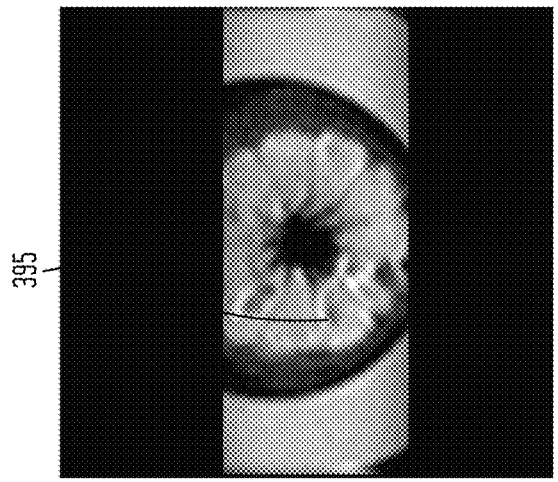
FIGS. 12A, 12B and 12C (collectively referred to as FIG. 12) are a set of images illustrating.
Figure 12B:
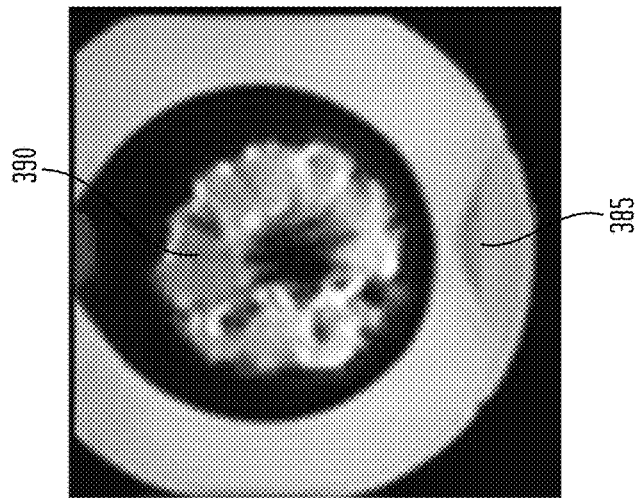
Figure 12A:
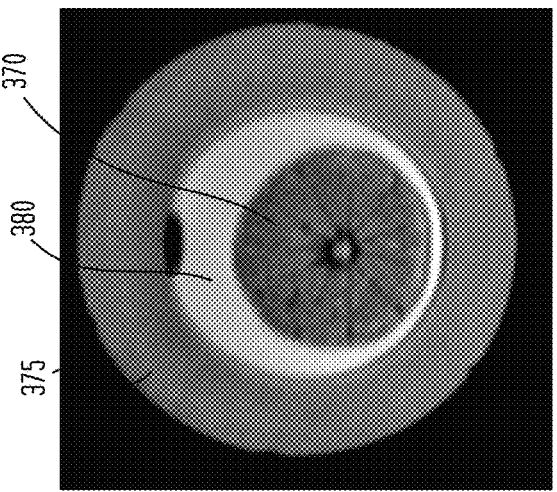

FIGS. 12A, 12B and 12C are a sequence of images illustrating: in FIG. 12A, a phantom image acquired using a conventional spin-echo pulse sequence; in FIG. 12B, a phantom image acquired using a conventional lipid-suppressed spin-echo EPI pulse with a chemical-shift artifact arising from the residual lipid signals; and in FIG. 12C, a phantom image segment with a reduced field of view acquired using the first representative 2D RF pulse and first magnetic field gradient sequences.

In FIG. 12A, a conventional spin-echo image shows the structures of the phantom containing water (outer region 375), corn coil (middle region 380 with a hyper signal), and an orange (central region 370). In FIG. 12B, a conventional lipid-suppressed spin-echo EPI image illustrates that the residual lipid signal can still cause a substantial chemical-shift artifact 385 along the phase-encoding direction, visible at the bottom of the image, and a small artifact visible at the top of the image. In FIG. 12C, the image of the phantom with reduced FOV shows reduced image distortion, excellent lipid suppression, as shown by an absence of chemical-shift artifacts, using the first representative 2D RF pulse 220 and first magnetic field gradient sequences. More importantly, the image distortion in the orange (395) is noticeably reduced in FIG. 12C when compared to FIG. 12B (390).

Figure 13A:
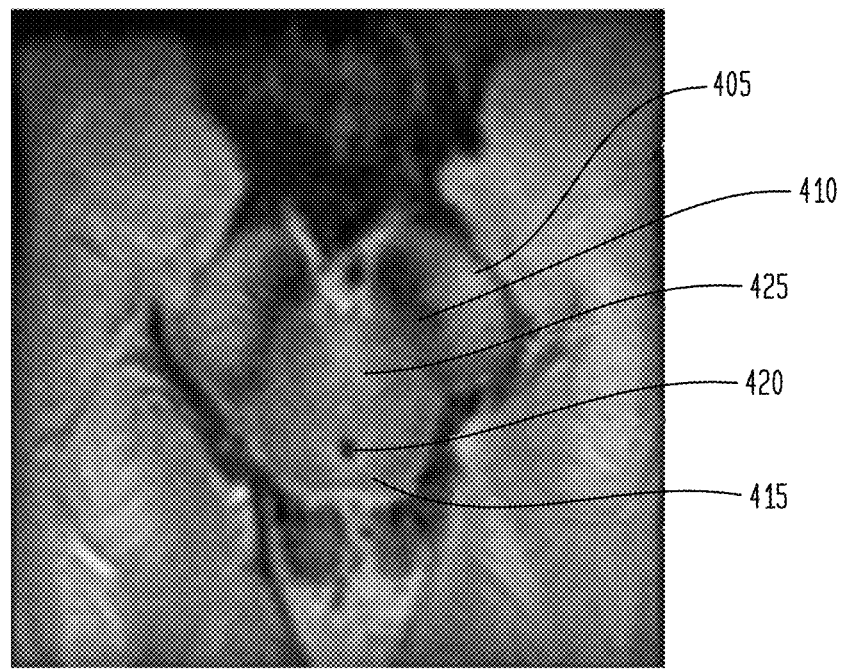
FIGS. 13A and 13B (collectively referred to as FIG. 13) are a pair of images acquired using the first representative 2D RF pulse and first magnetic field gradient sequences for segment selection and illustrating two frames of high-resolution, diffusion-weighted brain stem images.
Figure 13B:
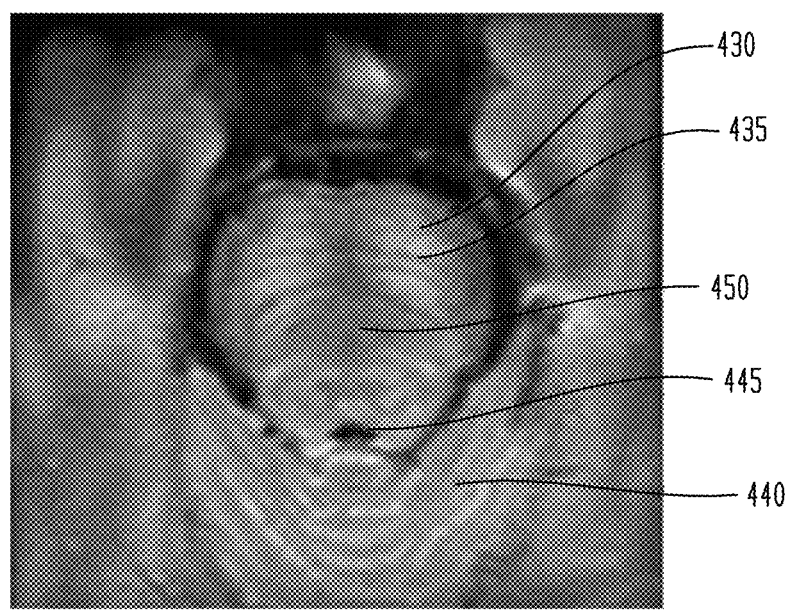

FIGS. 13A and 13B are two frames of images acquired on human subjects using the first representative 2D RF pulse and first magnetic field gradient sequences and illustrating high-resolution, diffusion-weighted brain stem images. FIGS. 13A and 13B demonstrate high spatial resolution being achieved using the 2D RF pulse (as in a single-shot EPI sequence) over a reduced FOV without any aliasing artifacts and with minimal image distortion. In FIG. 13A, the anatomic details are: crus cerebri 405, substantia nigra 410, medial lemniscus 415, cerebral aqueduct 420, and inferior colliculus 425. In FIG. 13B, the anatomic details are: corticospinal track 430, transverse pontine track 435, medial lemniscus 440, fourth ventricle 445, and cerebellum 450.

Figure 14:
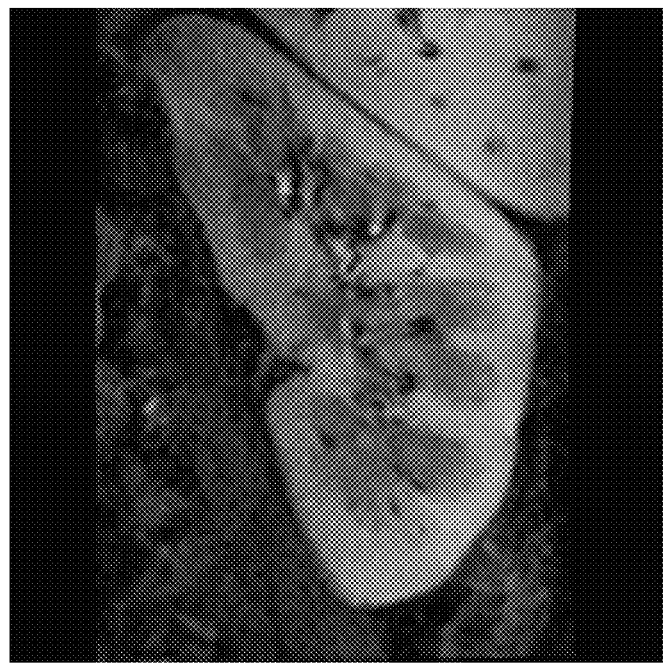
FIG. 14 is a kidney image acquired using the first representative 2D RF pulse and first magnetic field gradient sequences for segment selection.

FIG. 14 is a diffusion-weighted kidney image from a living human subject acquired using the first representative 2D RF pulse and first magnetic field gradient sequences, and further demonstrates the high spatial resolution being achieved using the 2D RF pulse over a reduced FOV without any aliasing artifacts and with minimal image distortion.

Figure 15:
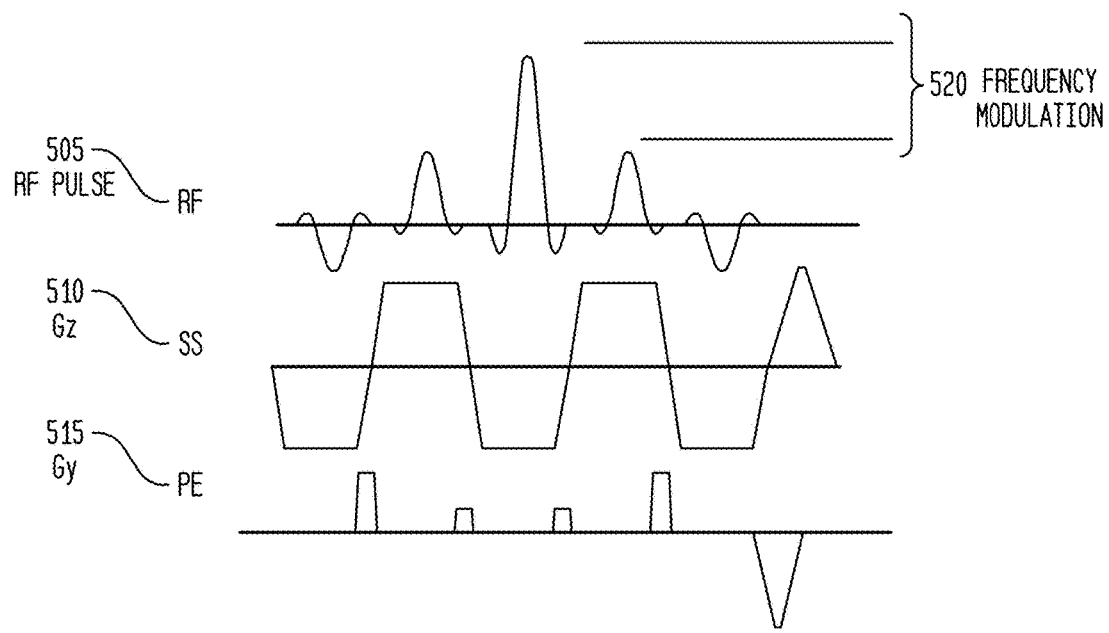
FIG. 15 is a diagram illustrating a second representative 2D RF pulse and second magnetic field gradient sequences for slice and segment selection for simultaneous segment acquisition.

FIG. 15 is a diagram illustrating a second representative 2D RF pulse and second magnetic field gradient sequences for slice and segment selection for simultaneous segment acquisition. Referring to FIG. 15, an in-plane (slice) simultaneous multi-segment ("SMS") technique can be incorporated into the iSeg-EPI pulse sequence (illustrated in and discussed above) to avoid the long scan time due to the acquisition of multiple segments, while still proving full spatial coverage. A representative pulse sequence, referred to herein as "iSeg-EPI-SMS", is shown in FIG. 15. To simultaneously excite multiple segments (all in the same plane or slice), one embodiment is to apply frequency modulation (520) to the 2D RF pulse 220 to produce multiple excitation bands simultaneously along the phase-encoding direction, illustrated in FIG. 15 as RF pulse 505, along with corresponding magnetic field gradients G"z and G"y (Gz 510 (slice selection (ss)) and Gy 515 (phase-encoding), also are illustrated prior to rotation and scaling to produce G"z and G"y). For example, the RF pulse may be modulated onto multiple carrier frequencies corresponding to different resonant frequencies, shifting the magnetic field gradients, and enabling acquisition of multiple segments, each using one of the multiple, superpositioned carrier frequencies. The subsequent 180° pulse is also frequency-modulated to match the excitation profiles. As mentioned above, data for each segment is then acquired using an RF receiver 180 having multiple receive coil elements with varying degrees of sensitivity to the particular segment. Unlike through-plane simultaneous multi-slice imaging where coil sensitivity profile is measured along the slice-selection direction for image reconstruction, this in-plane SMS technique will also use the 2D RF spatial profile w(y) (discussed above) to synthesize a sensitivity profile (i.e., a pseudo coil sensitivity profile) to be employed in image reconstruction. Once the pseudo sensitivity profile is obtained, image reconstruction can proceed using established methods. The iSeg-EPI-SMS sequence can be used in circumstances where the full FOV coverage is important, such as for the whole-brain studies. The RF frequency modulation is only one example to illustrate that multiple segments can be excited simultaneously. Other multi-segment simultaneous excitation approaches can also be incorporated into the iSeg-EPI-SMS pulse sequence.

It should be noted that blip-Caipi potentially can also be incorporated into the iSeg-EPI pulse sequence to enable through-plane acceleration, separately from or jointly with the aforementioned SMS imaging.

Figure 16:
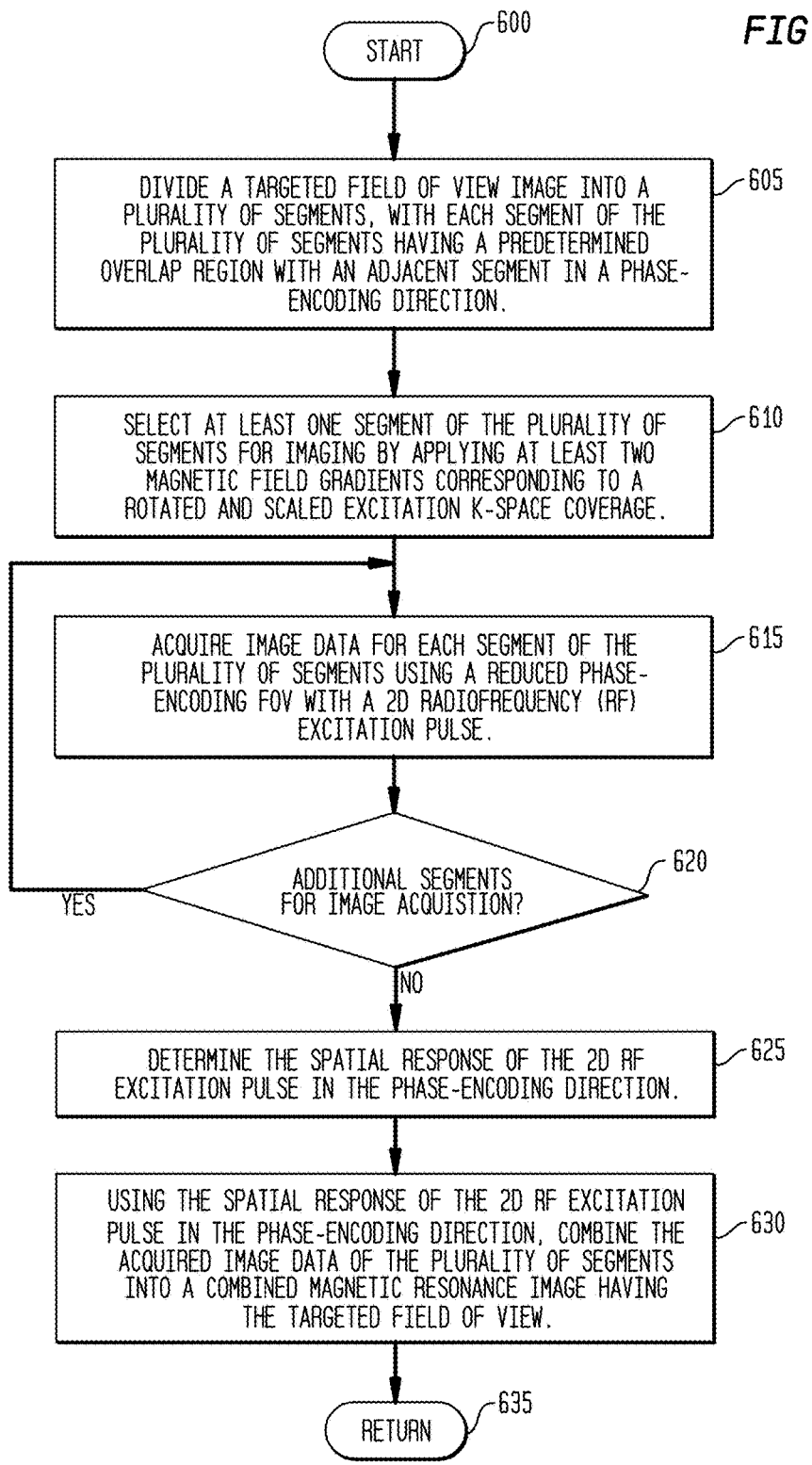
FIG. 16 is a flow chart of first and second representative method embodiments for reducing image distortion in echo planar magnetic resonance imaging.

FIG. 16 is a flow chart of first and second representative method embodiments for reducing image distortion in magnetic resonance imaging, and provides a useful summary. As mentioned above, the first and second methods differ with regard to sequential or simultaneous segmented image acquisition. The representative method embodiments begin, start step 600, with dividing a targeted field of view image into a plurality of segments, with each segment of the plurality of segments having a predetermined overlap region with an adjacent segment in a phase-encoding direction, step 605.

In step 610, at least one segment of the plurality of segments is selected for imaging by applying a pulse sequence of at least two magnetic field gradients corresponding to a rotated and scaled excitation k-space coverage, e.g., applying the first magnetic field gradient sequences discussed above. In representative embodiments, the first magnetic field gradient (G"y) is generally or substantially in the phase-encoding direction and a second magnetic field gradient (G"z) is generally or substantially in a slice-selection direction. In representative embodiments, the first magnetic field gradient (G"y) and the second magnetic field gradient (G"z) are determined as G"y=a·G'y and G"z=b·G'z, where $$\begin{bmatrix} G'y \\ G'z \end{bmatrix} = \begin{bmatrix} \cos\theta & \sin\theta \\ -\sin\theta & \cos\theta \end{bmatrix} \begin{bmatrix} Gy \\ Gz \end{bmatrix},$$

where θ is a predetermined angle of rotation, a and b are predetermined scaling factors, and Gy and Gz are orthogonal magnetic field gradients defining an on-axis square k-space, to form the two magnetic field gradients corresponding to the rotated and scaled excitation k-space coverage. It should be noted that once rotated and scaled, the first magnetic field gradient (G"y) and the second magnetic field gradient (G"z) may no longer be orthogonal.

In step 615, image data is acquired for each segment of the plurality of segments using a reduced phase-encoding FOV with a 2D radiofrequency (RF) excitation pulse. In representative embodiments, the 2D radiofrequency (RF) excitation pulse traverses an EPI-like excitation k-space trajectory using a set of EPI-like magnetic field gradient waveforms. For the first method embodiment, where there are remaining segments for image data acquisition, step 620, the method returns to step 615 and acquires image data for the next segment of the plurality of segments.

For the second method embodiment, image data is acquired simultaneously for all of the segments of the plurality of segments. As mentioned above, for example and without limitation, the image data for the plurality of segments may be simultaneously acquired using the 2D radiofrequency (RF) excitation pulse modulated onto a plurality of different carrier frequencies. Other simultaneous acquisition methods may be utilized equivalently.

Next, in step 625, the spatial response of the 2D radiofrequency (RF) excitation pulse is determined. In a representative embodiment, for example and without limitation, the spatial response may be determined using Bloch equation simulations. Other methods of determining the spatial response of the 2D radiofrequency (RF) excitation pulse may be utilized equivalently.

In step 630, using the spatial response of the 2D radiofrequency (RF) excitation pulse in the phase-encoding direction, the image data for the plurality of segments are combined into a combined magnetic resonance image having the targeted field of view. For example, the step of combining the image data for the plurality of segments into a combined magnetic resonance image having the targeted field of view may further comprise: combining individual segments using $S(y)=\Sigma_{i=1}{}^{n}w_i(y)S_i(y)/\Sigma_{i=1}{}^{n}w_i{}^2(y)$ where n is the total number of segments, $w_i(y)$ is the 2D RF pulse spatial response along the phase-encoding direction, and i represents the ith segment. Following step 630, the method may end, return step 635.

Figure 17:
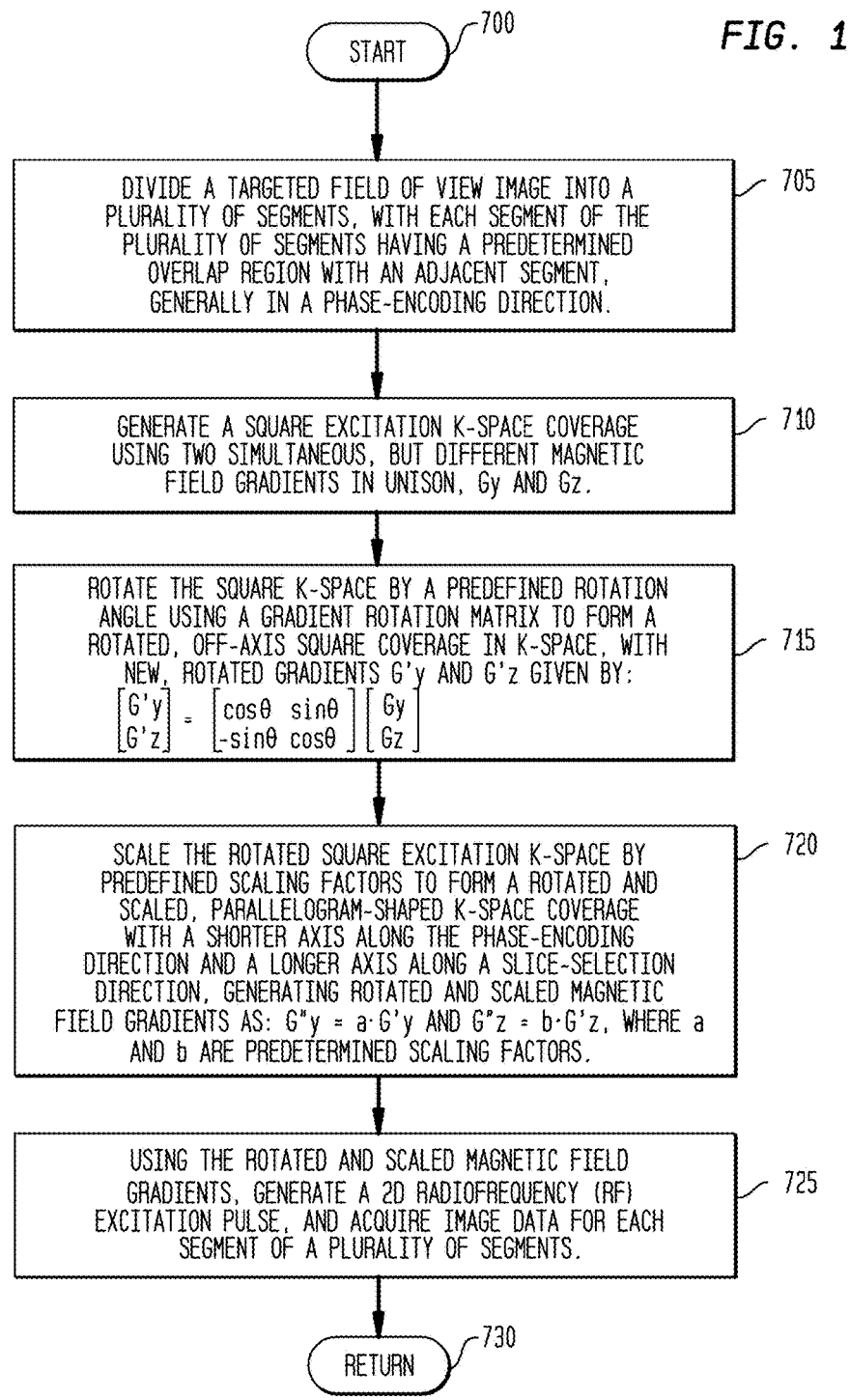
FIG. 17 is a flow chart illustrating in greater detail a representative method embodiment for generating rotated and scaled magnetic field gradients having a parallelogram k-space coverage.

FIG. 17 is a flow chart providing greater detail of steps 605, 610 and 615 of FIG. 16, illustrating a representative method embodiment for generating rotated and scaled magnetic field gradients having a parallelogram excitation k-space coverage, and provides a useful summary. The representative method embodiment begins, start step 700, also with dividing a targeted field of view image into a plurality of segments, with each segment of the plurality of segments having a predetermined overlap region with an adjacent segment in a phase-encoding direction, step 705. Next, in step 710, a square excitation k-space coverage is generated using two simultaneous, but different magnetic field gradients in unison, Gy and Gz. In step 715, the square k-space is rotated by a predefined rotation angle using a gradient rotation matrix to form a rotated, off-axis square coverage in k-space, with new, rotated magnetic field gradients G'y and G'z given by:

$$\begin{bmatrix} G'y \\ G'z \end{bmatrix} = \begin{bmatrix} \cos\theta & \sin\theta \\ -\sin\theta & \cos\theta \end{bmatrix} \begin{bmatrix} Gy \\ Gz \end{bmatrix}.$$

The rotated square k-space is then scaled by predefined scaling factors, step 720, to form a rotated and scaled, parallelogram-shaped k-space coverage with a shorter axis along the phase-encoding direction and a longer axis along a slice-selection direction, generating rotated and scaled magnetic field gradients as: G"y=a·G'y and G"z=b·G'z, where a and b are predetermined scaling factors. Next, using the rotated and scaled magnetic field gradients G"y and G"z, in step 725, a 2D radiofrequency (RF) excitation pulse is generated and image data is acquired, sequentially (repeating step 725 for each segment of a plurality of segments) or simultaneously (e.g., using the modulated 2D RF excitation pulse described above), for a plurality of segments. Following step 725 (and any repetition of step 725), the method may end, return step 730.

Numerous advantages of the representative embodiments are readily apparent. The benefits of the disclosed methods and system include more accurate imaging, which enhances or enables medical diagnoses and/or image-guided medical treatments. The representative embodiments provide improved spatial co-registration between anatomic images and functional/physiologic/metabolic images. In addition, the representative embodiments provide more robust imaging in anatomically challenging regions that have been prohibitive using conventional EPI techniques, and/or improved spatial resolution over a large field of view.

The present disclosure is to be considered as an exemplification of the principles of the invention and is not intended to limit the invention to the specific embodiments illustrated. In this respect, it is to be understood that the invention is not limited in its application to the details of construction and to the arrangements of components set forth above and below, illustrated in the drawings, or as described in the examples. Systems, methods and apparatuses consistent with the present invention are capable of other embodiments and of being practiced and carried out in various ways.

Although the invention has been described with respect to specific embodiments thereof, these embodiments are merely illustrative and not restrictive of the invention. In the description herein, numerous specific details are provided, such as examples of electronic components, electronic and structural connections, materials, and structural variations, to provide a thorough understanding of embodiments of the present invention. One skilled in the relevant art will recognize, however, that an embodiment of the invention can be practiced without one or more of the specific details, or with other apparatus, systems, assemblies, components, materials, parts, etc. In other instances, well-known structures, materials, or operations are not specifically shown or described in detail to avoid obscuring aspects of embodiments of the present invention. In addition, the various Figures are not drawn to scale and should not be regarded as limiting.

Reference throughout this specification to "one embodiment", "an embodiment", or a specific "embodiment" means that a particular feature, structure, or characteristic described in connection with the embodiment is included in at least one embodiment of the present invention and not necessarily in all embodiments, and further, are not necessarily referring to the same embodiment. Furthermore, the particular features, structures, or characteristics of any specific embodiment of the present invention may be combined in any suitable manner and in any suitable combination with one or more other embodiments, including the use of selected features without corresponding use of other features. In addition, many modifications may be made to adapt a particular application, situation or material to the essential scope and spirit of the present invention. It is to be understood that other variations and modifications of the embodiments of the present invention described and illustrated herein are possible in light of the teachings herein and are to be considered part of the spirit and scope of the present invention.

It will also be appreciated that one or more of the elements depicted in the Figures can also be implemented in a more separate or integrated manner, or even removed or rendered inoperable in certain cases, as may be useful in accordance with a particular application. Integrally formed combinations of components are also within the scope of the invention, particularly for embodiments in which a separation or combination of discrete components is unclear or indiscernible. In addition, use of the term "coupled" herein, including in its various forms such as "coupling" or "couplable", means and includes any direct or indirect electrical, structural or magnetic coupling, connection or attachment, or adaptation or capability for such a direct or indirect electrical, structural or magnetic coupling, connection or attachment, including integrally formed components and components which are coupled via or through another component.

A "processor" 120, 160 may be any type of controller or processor, and may be embodied as one or more processor(s) 120, 160, configured, designed, programmed or otherwise adapted to perform the functionality discussed herein. As the term controller or processor is used herein, a processor 120, 160 may include use of a single integrated circuit ("IC"), or may include use of a plurality of integrated circuits or other components connected, arranged or grouped together, such as controllers, microprocessors, digital signal processors ("DSPs"), array processors, graphics or image processors, parallel processors, multiple core processors, custom ICs, application specific integrated circuits ("ASICs"), field programmable gate arrays ("FPGAs"), adaptive computing ICs, associated memory (such as RAM, DRAM and ROM), and other ICs and components, whether analog or digital. As a consequence, as used herein, the term processor (or controller) should be understood to equivalently mean and include a single IC, or arrangement of custom ICs, ASICs, processors, microprocessors, controllers, FPGAs, adaptive computing ICs, or some other grouping of integrated circuits which perform the functions discussed below, with associated memory, such as microprocessor memory or additional RAM, DRAM, SDRAM, SRAM, MRAM, ROM, FLASH, EPROM or EPROM. A controller (or processor) (such as processor(s) 120, 160), with associated memory, may be adapted or configured (via programming, FPGA interconnection, or hard-wiring) to perform the methodology of the invention, as discussed herein. For example, the methodology may be programmed and stored, in a processor 120, 160 with its associated memory (and/or memory 125, 155) and other equivalent components, as a set of program instructions or other code (or equivalent configuration or other program) for subsequent execution when the processor is operative (i.e., powered on and functioning). Equivalently, when the processor 120, 160 may implemented in whole or part as FPGAs, custom ICs and/or ASICs, the FPGAs, custom ICs or ASICs also may be designed, configured and/or hard-wired to implement the methodology of the invention. For example, the processor 120, 160 may be implemented as an arrangement of analog and/or digital circuits, controllers, microprocessors, DSPs and/or ASICs, collectively referred to as a "processor", which are respectively hard-wired, programmed, designed, adapted or configured to implement the methodology of the invention, including possibly in conjunction with a memory 125, 155.

The memory 125, 155, which may include a data repository (or database), may be embodied in any number of forms, including within any computer or other machine-readable data storage medium, memory device or other storage or communication device for storage or communication of information, currently known or which becomes available in the future, including, but not limited to, a memory integrated circuit ("IC"), or memory portion of an integrated circuit (such as the resident memory within a processor 120, 160 or processor IC), whether volatile or non-volatile, whether removable or non-removable, including without limitation RAM, FLASH, DRAM, SDRAM, SRAM, MRAM, FeRAM, ROM, EPROM or EPROM, or any other form of memory device, such as a magnetic hard drive, an optical drive, a magnetic disk or tape drive, a hard disk drive, other machine-readable storage or memory media such as a floppy disk, a CDROM, a CD-RW, digital versatile disk (DVD) or other optical memory, or any other type of memory, storage medium, or data storage apparatus or circuit, which is known or which becomes known, depending upon the selected embodiment. The memory 125, 155 may be adapted to store various look up tables, parameters, coefficients, other information and data, programs or instructions (of the software of the present invention), and other types of tables such as database tables.

As indicated above, the processor 120, 160 is hard-wired or programmed, using software and data structures of the invention, for example, to perform the methodology of the present invention. As a consequence, the system and method of the present invention may be embodied as software which provides such programming or other instructions, such as a set of instructions and/or metadata embodied within a non-transitory computer readable medium, discussed above. In addition, metadata may also be utilized to define the various data structures of a look up table or a database. Such software may be in the form of source or object code, by way of example and without limitation. Source code further may be compiled into some form of instructions or object code (including assembly language instructions or configuration information). The software, source code or metadata of the present invention may be embodied as any type of code, such as C, C++, Matlab, SystemC, LISA, XML, Java, Brew, SQL and its variations (e.g., SQL 99 or proprietary versions of SQL), DB2, Oracle, or any other type of programming language which performs the functionality discussed herein, including various hardware definition or hardware modeling languages (e.g., Verilog, VHDL, RTL) and resulting database files (e.g., GDSII). As a consequence, a "construct", "program construct", "software construct" or "software", as used equivalently herein, means and refers to any programming language, of any kind, with any syntax or signatures, which provides or can be interpreted to provide the associated functionality or methodology specified (when instantiated or loaded into a processor or computer and executed, including the processor 120, 160, for example).

The software, metadata, or other source code of the present invention and any resulting bit file (object code, database, or look up table) may be embodied within any tangible, non-transitory storage medium, such as any of the computer or other machine-readable data storage media, as computer-readable instructions, data structures, program modules or other data, such as discussed above with respect to the memory 125, 155, e.g., a floppy disk, a CDROM, a CD-RW, a DVD, a magnetic hard drive, an optical drive, or any other type of data storage apparatus or medium, as mentioned above.

The I/O interfaces 130, 165 are utilized for appropriate connection to a relevant channel, network or bus; for example, the I/O interfaces 130, 165 may provide impedance matching, drivers and other functions for a wireline interface, may provide demodulation and analog to digital conversion for a wireless interface, and may provide a physical interface for the processor 120, 160 and/or memory 125, 155 with other devices. In general, the I/O interfaces 130, 165 are used to receive and transmit data, depending upon the selected embodiment, such as program instructions, parameters, configuration information, control messages, data and other pertinent information.

The I/O interfaces 130, 165 may be implemented as known or may become known in the art, to provide data communication between the processor 120, 160 and any type of network or external device, such as wireless, optical, or wireline, and using any applicable standard (e.g., one of the various PCI, USB, RJ 45, Ethernet (Fast Ethernet, Gigabit Ethernet, 100Base-TX, 100Base-FX, etc.), IEEE 802.11, WCDMA, WiFi, GSM, GPRS, EDGE, or 3G standards, for example and without limitation), and may include impedance matching capability, voltage translation for a low voltage processor to interface with a higher voltage control bus, wireline or wireless transceivers, and various switching mechanisms (e.g., transistors) to turn various lines or connectors on or off in response to signaling from the processor 120, 160. In addition, the I/O interfaces 130, 165 may also be configured and/or adapted to receive and/or transmit signals externally to the MRI system 100, such as through hard-wiring or RF or infrared signaling, for example, to receive information in real-time for output on a display 145, for example. The I/O interfaces 130, 165 may provide connection to any type of bus or network structure or medium, using any selected architecture. By way of example and without limitation, such architectures include Industry Standard Architecture (ISA) bus, Enhanced ISA (EISA) bus, Micro Channel Architecture (MCA) bus, Peripheral Component Interconnect (PCI) bus, SAN bus, or any other communication or signaling medium, such as Ethernet, ISDN, T1, satellite, wireless, and so on.

With respect to signals, we refer herein to parameters that "represent" a given metric or are "representative" of a given metric, where a metric is a measure of a state of at least part of the regulator or its inputs or outputs. A parameter is considered to represent a metric if it is related to the metric directly enough that regulating the parameter will satisfactorily regulate the metric. For example, the various parameters specifying the magnetic field gradients and 2D RF excitation pulse of the disclosure may be represented by metrics such as a time-bandwidth product, time delay, pulse width, and so on, as is customary in the art. A parameter may be considered to be an acceptable representation of a metric if it represents a multiple or fraction of the metric.

Furthermore, any signal arrows in the drawings/Figures should be considered only exemplary, and not limiting, unless otherwise specifically noted. Combinations of components of steps will also be considered within the scope of the present invention, particularly where the ability to separate or combine is unclear or foreseeable. The disjunctive term "or", as used herein and throughout the claims that follow, is generally intended to mean "and/or", having both conjunctive and disjunctive meanings (and is not confined to an "exclusive or" meaning), unless otherwise indicated. As used in the description herein and throughout the claims that follow, "a", "an", and "the" include plural references unless the context clearly dictates otherwise. Also as used in the description herein and throughout the claims that follow, the meaning of "in" includes "in" and "on" unless the context clearly dictates otherwise.

The foregoing description of illustrated embodiments of the present invention, including what is described in the summary or in the abstract, is not intended to be exhaustive or to limit the invention to the precise forms disclosed herein. From the foregoing, it will be observed that numerous variations, modifications and substitutions are intended and may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

The invention claimed is:

1. A method for reducing image distortion or increasing spatial resolution in magnetic resonance imaging (MRI), comprising:
   using an MRI system, dividing a targeted field of view image into a plurality of segments, each segment of the plurality of segments having a predetermined overlap region with an adjacent segment;
   using the MRI system, acquiring image data for each segment of the plurality of segments using a reduced field of view with a 2D radiofrequency (RF) excitation pulse;
   using the MRI system, determining a spatial response of the 2D radiofrequency (RF) excitation pulse; and
   using the spatial response of the 2D radiofrequency (RF) excitation pulse in the phase-encoding direction, and using the MRI system, combining the acquired image data for each segment of the plurality of segments to generate a combined magnetic resonance image having the targeted field of view.

2. The method of claim 1, further comprising:
   using the MRI system, selecting at least one segment of the plurality of segments for imaging by applying a pulse sequence of at least two magnetic field gradients corresponding to a rotated and scaled excitation k-space coverage.

3. The method of claim 2, wherein a first magnetic field gradient (G"y) is substantially in the phase-encoding direction and a second magnetic field gradient (G"z) is substantially in a slice-selection direction.

4. The method of claim 3, wherein the first magnetic field gradient (G"y) and the second magnetic field gradient (G"z) have been rotated and scaled to correspond to the rotated and scaled excitation k-space coverage, and have been determined as G"y=a·G'y and G"z=b·G'z, where $$\begin{bmatrix} G'y \\ G'z \end{bmatrix} = \begin{bmatrix} \cos\theta & \sin\theta \\ -\sin\theta & \cos\theta \end{bmatrix} \begin{bmatrix} Gy \\ Gz \end{bmatrix},$$

where θ is a predetermined angle of rotation, a and b are predetermined scaling factors, and Gy and Gz are orthogonal magnetic field gradients defining an on-axis square excitation k-space.

5. The method of claim 1, wherein using the spatial response of the 2D radiofrequency (RF) excitation pulse further comprises:
   using the MRI system, weighting corresponding image intensities within the predetermined overlap region of a segment with an adjacent segment to provide a normalized image intensity.

6. The method of claim 1, wherein the step of combining the acquired image data for each segment of the plurality of segments to generate a combined magnetic resonance image having the targeted field of view further comprises:
   using the MRI system, combining individual segments using:

$$S(y) = \sum_{i=1}^{n} w_i(y) S_i(y) \bigg/ \sum_{i=1}^{n} w_i^2(y)$$

where $S_i(y)$ is segmented image data, n is the total number of segments, $w_i(y)$ is the 2D RF pulse spatial response along the phase-encoding direction, and i represents the ith segment.

7. The method of claim 1, wherein the step of acquiring image data for each segment of the plurality of segments further comprises:
   using the MRI system, simultaneously acquiring the image data for the plurality of segments using the 2D radiofrequency (RF) excitation pulse modulated to simultaneously excite the plurality of segments.

8. The method of claim 1, wherein the step of acquiring image data for each segment of the plurality of segments further comprises:
   using the MRI system, simultaneously acquiring the image data for the plurality of segments using the 2D radiofrequency (RF) excitation pulse modulated onto a plurality of different carrier frequencies.

9. The method of claim 1, wherein the plurality of segments have at least one shape selected from the group consisting of: a plurality of parallel rectangles having predetermined overlap regions with an adjacent segment in a phase-encoding direction; a plurality of parallel rectangles in the phase-encoding direction having varying widths or aspect ratios in the phase-encoding direction; a plurality of concentric rings; a tiling of a plurality of geometric shapes covering the targeted field of view; and combinations thereof.

10. A magnetic resonance imaging (MRI) system for reducing image distortion or increasing spatial resolution in echo planar magnetic resonance (MR) images, comprising:
an RF transmitter adapted to generate a 2D radiofrequency (RF) excitation pulse;
an RF receiver adapted to acquire image data for each segment of a plurality of segments using a reduced phase-encoding field of view; and
one or more processors adapted to divide a targeted field of view image into the plurality of segments, each segment of the plurality of segments having a predetermined overlap region with an adjacent segment; to determine a spatial response of the 2D radiofrequency (RF) excitation pulse; and using the spatial response of the 2D radiofrequency (RF) excitation pulse, to combine the acquired image data for each segment of the plurality of segments to generate a combined magnetic resonance image having the targeted field of view.

11. The system of claim 10, wherein the one or more processors are further adapted to select at least one segment of the plurality of segments for imaging by determining at least two magnetic field gradients corresponding to a rotated and scaled excitation k-space coverage; and the system further comprising:
at least one gradient coil assembly to generate a pulse sequence of the at least two magnetic field gradients corresponding to the rotated and scaled excitation k-space coverage.

12. The system of claim 11, wherein a first magnetic field gradient (G"y) is substantially in the phase-encoding direction and a second magnetic field gradient (G"z) is substantially in a slice-selection direction.

13. The system of claim 12, wherein the first magnetic field gradient (G"y) and the second magnetic field gradient (G"z) have been rotated and scaled to correspond to the rotated and scaled excitation k-space coverage, and wherein the one or more processors are further adapted to determine the first magnetic field gradient (G"y) and the second magnetic field gradient (G"z) as G"y=a·G'y and G"z=b·G'z, where $$\begin{bmatrix} G'y \\ G'z \end{bmatrix} = \begin{bmatrix} \cos\theta & \sin\theta \\ -\sin\theta & \cos\theta \end{bmatrix} \begin{bmatrix} Gy \\ Gz \end{bmatrix},$$

where θ is a predetermined angle of rotation, a and b are predetermined scaling factors, and Gy and Gz are orthogonal magnetic field gradients defining a square excitation k-space.

14. The system of claim 10, wherein the one or more processors are further adapted to weight corresponding image intensities within the predetermined overlap region of a segment with an adjacent segment to provide a normalized image intensity.

15. The system of claim 10, wherein the wherein the one or more processors are further adapted to generate the combined magnetic resonance image having the targeted field of view by combining individual segments using:

$$S(y) = \sum_{i=1}^{n} w_i(y) S_i(y) \Big/ \sum_{i=1}^{n} w_i^2(y)$$

where $S_i(y)$ is segmented image data, n is the total number of segments, $w_i(y)$ is the 2D RF pulse spatial response along the phase-encoding direction, and i represents the ith segment.

16. The system of claim 10, wherein RF transmitter is further adapted to modulate the 2D radiofrequency (RF) excitation pulse to simultaneously excite the plurality of segments.

17. The system of claim 10, wherein RF transmitter is further adapted to modulate the 2D radiofrequency (RF) excitation pulse onto a plurality of different carrier frequencies for simultaneous acquisition of the image data for the plurality of segments.

18. The system of claim 10, wherein the plurality of segments have at least one shape selected from the group consisting of: a plurality of parallel rectangles having predetermined overlap regions with an adjacent segment in a phase-encoding direction; a plurality of parallel rectangles in the phase-encoding direction having varying widths or aspect ratios in the phase-encoding direction; a plurality of concentric rings; a tiling of a plurality of geometric shapes covering the targeted field of view; and combinations thereof.

19. A magnetic resonance imaging (MRI) system for reducing image distortion or increasing spatial resolution in echo planar magnetic resonance (MR) images, comprising:
an RF transmitter adapted to generate a 2D radiofrequency (RF) excitation pulse;
an RF receiver adapted to acquire image data for each segment of a plurality of segments using a reduced phase-encoding field of view;
a gradient coil assembly to generate magnetic field gradients; and
one or more processors coupled to the RF transmitter, the RF receiver, and the gradient coil assembly, the one or more processors adapted to divide a targeted field of view image into the plurality of segments, with each segment of the plurality of segments having a predetermined overlap region with an adjacent segment in a phase-encoding direction; to generate an on-axis square excitation k-space coverage with two simultaneous, different magnetic field gradients in unison; to rotate the square excitation k-space by a predefined rotation angle using a gradient rotation matrix to form a rotated, off-axis square coverage in excitation k-space; to scale the rotated square excitation k-space by predefined scaling factors to generate rotated and scaled magnetic field gradients; to generate one or more first control signals to the gradient coil assembly to use a pulse sequence of the rotated and scaled magnetic field gradients; to generate one or more second control signals to the RF transmitter to generate the 2D radiofrequency (RF) excitation pulse timed with the rotated and scaled field magnetic field gradients; and to generate one or more third control signals to the RF receiver to acquire image data for each segment of a plurality of segments.

20. The system of claim 19, wherein the one or more processors are further adapted to determine a spatial response of the 2D radiofrequency (RF) excitation pulse; and using the spatial response of the 2D radiofrequency (RF) excitation pulse, to combine the acquired image data for each segment of the plurality of segments to generate a combined magnetic resonance image having the targeted field of view.

* * * * *